US009059586B2

(12) United States Patent
Tseng et al.

(10) Patent No.: US 9,059,586 B2
(45) Date of Patent: Jun. 16, 2015

(54) THROUGH SILICON VIA BIDIRECTIONAL REPAIR CIRCUIT OF SEMICONDUCTOR APPARATUS

(71) Applicant: Industrial Technology Research Institute, Hsinchu (TW)

(72) Inventors: Pei-Ling Tseng, Miaoli County (TW); Keng-Li Su, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 209 days.

(21) Appl. No.: 13/900,546

(22) Filed: May 23, 2013

(65) Prior Publication Data

US 2014/0185174 A1 Jul. 3, 2014

(30) Foreign Application Priority Data

Dec. 28, 2012 (TW) .............................. 101150804 A

(51) Int. Cl.
*H02H 3/00* (2006.01)
*H02H 3/20* (2006.01)
(52) U.S. Cl.
CPC .......... *H02H 3/20* (2013.01); *H01L 2924/0002* (2013.01)
(58) Field of Classification Search
CPC ................................................ H03K 17/0822
USPC ........................................................ 361/93.1
See application file for complete search history.

(56) References Cited

U.S. PATENT DOCUMENTS

| | | | |
|---|---|---|---|
| 7,969,193 B1 * | 6/2011 | Wu et al. ........................ 326/82 |
| 7,977,962 B2 | 7/2011 | Hargan et al. | |
| 8,110,892 B2 | 2/2012 | Lee et al. | |
| 8,169,254 B2 | 5/2012 | Jin | |
| 8,193,006 B2 * | 6/2012 | Chou et al. ...................... 438/12 |
| 8,854,853 B2 * | 10/2014 | Chou et al. ...................... 365/51 |
| 2010/0060310 A1 | 3/2010 | Laisne et al. | |
| 2010/0127758 A1 | 5/2010 | Hollis | |
| 2010/0295600 A1 | 11/2010 | Kim et al. | |

(Continued)

FOREIGN PATENT DOCUMENTS

TW 201101316 1/2011

OTHER PUBLICATIONS

Liu et al., "A Compact Low-Power 3D I/O in 45nm CMOS," 2012 IEEE International Solid-State Circuits Conference Digest of Technical Papers (ISSCC), Feb. 19-23, 2012, pp. 142-144.

(Continued)

*Primary Examiner* — Stephen W Jackson
(74) *Attorney, Agent, or Firm* — Jianq Chyun IP Office

(57) ABSTRACT

A TSV bidirectional repair circuit of a semiconductor apparatus is provided. The bidirectional repair circuit includes a first and a second bidirectional switches and at least two transmission path modules. The first and the second bidirectional switches determine whether to transmit an input signal of a first chip or a second chip to each of the transmission path modules according to a switch signal. Each transmission path module includes at least two data path circuits and corresponding TSVs. Each data path circuit includes an input driving circuit, a short-circuit detection circuit and a leakage current cancellation circuit. The short-circuit detection circuit detects whether short-circuit on the corresponding TSV and a silicon substrate is present according to the input signal and the corresponding TSV to produce a short-circuit detection output signal.

50 Claims, 10 Drawing Sheets

(56) References Cited

U.S. PATENT DOCUMENTS

2011/0110064 A1  5/2011  Foster, Sr. et al.
2012/0147979 A1  6/2012  Best et al.

OTHER PUBLICATIONS

Tsai et al., "Through Silicon Via(TSV) Defect/Pinhole Self Test Circuit for 3D-IC," IEEE International Conference on 3D System Integration (3DIC 2009), Sep. 28-30, 2009, pp. 1-8.

Hsieh et al, "TSV Redundancy: Architecture and Design Issues in 3D IC," Design, Automation & Test in Europe Conference & Exhibition (Date), Mar. 8-12, 2010, pp. 166-171.

Huang et al., "Built-in Self-Test/Repair Scheme for TSV-Based Three-Dimensional Integrated Circuits," 2010 IEEE Asia Pacific Conference on Circuits and Systems (APCCAS), Dec. 6-9, 2010, pp. 56-59.

Kang et al., "8 Gb 3-D DDR3 DRAM Using Through-Silicon-Via Technology," IEEE Journal of Solid-State Circuits 45(1), Jan. 2010, pp. 111-119.

* cited by examiner

THROUGH SILICON VIA BIDIRECTIONAL REPAIR CIRCUIT OF SEMICONDUCTOR APPARATUS

CROSS-REFERENCE TO RELATED APPLICATION

This application claims the priority benefit of Taiwan application serial no. 101150804, filed on Dec. 28, 2012. The entirety of the above-mentioned patent application is hereby incorporated by reference herein and made a part of this specification.

TECHNICAL FIELD

The disclosure relates to a technique for stacking integrated circuits, and relates to a through silicon via (TSV) bidirectional repair circuit of a semiconductor device.

BACKGROUND

With rapid growing of transistors amount in an integrated circuit (IC), areas of chip being used is increased accordingly, resulting problems such as delay time and power consumption of signal to get worse each day. In order to improve such critical problem in delay time and power consumption, a three dimensional IC (3DIC) stacking technology is an effective solution under development today. Said technology performs vertically stacking to a plurality of chips in 3D space, signals and power voltages are transmitted by utilizing through silicon vias (TSVs) being passed through silicon substrates in between different chips, so as to achieve an optimal effect in size reduction.

Processing technology of the 3DIC mainly focused in three steps: first step includes forming TSV channels and filling a conductive metal; second step includes performing a thinner process to wafers; and third step includes stacking and bonding chips together. In the first step, as restricted by the processing technology at the present stage, an insulating thin film (e.g., SiO2) on sidewalls of TSVs may be broken or invaded by foreign impurity, resulting an open-circuit of the TSVs or a short-circuit of the silicon substrate. Also, in the third step when a plurality of ICs are stacked, due to small position offset, the TSVs may not be correctly turned on to each other, resulting an open-circuit, that is, TSVs may fail to provide effective paths between different chips for transmitting signal.

In conventional 2DIC design, said problem in data transmission may be prevented by utilizing a plurality of paths to transmit the same signal at the same time. However, in 3DIC technology, once one of the TSVs has short-circuit on the silicon substrate, leakage current generated by power voltage may flow into the silicon substrate through the TSV, resulting overall voltage level in the silicon substrate to shift and become unstable, such that errors in transmission may occur since signals transmitted in other TSVs may also be affected by shifted voltage level in the silicon substrate. Therefore, many of manufacturers in 3DIC field are in searching for a bidirectional data transmission circuit with capabilities of automatically detecting short defect of the TSVs and self-repairing data.

SUMMARY

The disclosure proposes a TSV bidirectional repair circuit of a semiconductor device, including a first chip and a second chip, a first bidirectional switch and a second bidirectional switch, at least two transmission path modules, a first output logical circuit and a second output logical circuit. The first chip and the second chip are stacked on top of each other. The first bidirectional switch and the second bidirectional switch are respectively disposed on the first chip and the second chip. The first bidirectional switch and the second bidirectional switch respectively receive a switch signal and an opposite switch signal as to determine whether to transmit an input signal of the first chip or the second chip to an output terminal. Each of the transmission path modules has two terminals respectively connected to the output terminals of the first bidirectional switch and the second bidirectional switch, and each of the transmission path modules includes at least one TSV. The first output logical circuit and the second output logical circuit are respectively disposed on the second chip and the first chip. Input terminals of the first output logical circuit and the second output logical circuit are respectively connected to a second terminal and a first terminal of the TSV, so as to respectively receive at least two first transmission signals and at least two second transmission signals thereby respectively generate a first output signal and a second output signal.

In one embodiment, each of the transmission path modules respectively includes at least one TSV, a first and a second data path circuits. Each TSV respectively passes through a silicon substrate to transmit signals between the first chip and the second chip. The first data path circuit and the second data path circuit are respectively disposed on the first chip and the second chip. Input terminals of the first data path circuit and the second data path circuit are respectively connected to the output terminals of the first bidirectional switch and the second bidirectional switch to receive the input signal of the first chip or the second chip. Input terminals of the first data path circuit and the second data path circuit are connected to a first terminal and a second terminal of the TSV, so as to transmit data through said TSV according to the switch signal or the opposite switch signal.

In one embodiment, the first data path circuit and the second data path circuit respectively includes an input driving circuit, a short-circuit detection circuit and a leakage current cancellation circuit. The input driving circuit receives the input signal, converts the input signal into a pending signal according to a first level voltage and a second level voltage, and transmits the pending signal to a corresponding terminal of the TSV. The short-circuit detection circuit connects the corresponding terminal of the TSV to detect whether short-circuit on the TSV and a silicon substrate is present according to the input signal, a level of the corresponding terminal of the TSV and one of the opposite switch signal and the switch signal and generate a short-circuit detection output signal. The leakage current cancellation circuit connects the short-circuit detection circuit and the input driving circuit to avoid a leakage current generated by the first level voltage to flow into the silicon substrate according to the short-circuit detection output signal.

From another embodiment of the disclosure, the disclosure proposes a TSV bidirectional repair circuit of a semiconductor device, including a plurality of chips, a first bidirectional switch and a second bidirectional switch, at least two TSVs, at least two data path modules and a plurality of output logical circuits. The plurality of chips are stacked on top of each other, and the plurality of chips include a first chip and a second chip. The first bidirectional switch and the second bidirectional switch are respectively disposed on the first chip and the second chip. The first and the second bidirectional switches respectively receive one of a switch signal and an opposite switch signal as to determine whether to transmit an input signal of the first chip or the second chip to an output terminal. The TSVs respectively pass through a silicon substrate to transmit signals between the plurality of chips.

In one embodiment, each of the data path modules includes at least two data path circuits having a same input terminal, the input terminal of each of the data path circuits is connected to output terminals of the first and the second bidirectional switches to receive the input signal. The output terminal of each of the data path circuits is connected to terminals of the at least two TSVs leading to a next-stage chip in a corresponding chip, so as to transmit data through the at least two TSVs according to one of the switch signal and the opposite switch signal. The plurality of output logical circuits are respectively disposed on any one chip. The input terminal of each of the output logical circuits is connected to terminals of the TSVs at the same side in said any one chip to receive at least two transmission signals and respectively generate the output signals.

In one embodiment, each data path circuit includes an input driving circuit, a short-circuit detection circuit and a leakage current cancellation circuit. The input driving circuit receives the input signal, converts the input signal into a pending signal according to a first level voltage and a second level voltage, and transmits the pending signal to a corresponding terminal of the TSV. The short-circuit detection circuit connects the corresponding terminal of the TSV to detect whether short-circuit on the TSV and a silicon substrate is present according to the input signal, a level of the corresponding terminal of the TSV and one of the opposite switch signal and the switch signal and generate a short-circuit detection output signal. The leakage current cancellation circuit connects the short-circuit detection circuit and the input driving circuit to avoid a leakage current generated by the first level voltage to flow into the silicon substrate according to the short-circuit detection output signal.

From yet another embodiment of the disclosure, the disclosure proposes a through silicon via (TSV) bidirectional repair circuit of a semiconductor device, including a plurality of chips, a first bidirectional switch and a second bidirectional switch, at least two TSVs, at least two data path modules and a plurality of output logical circuits. The plurality of chips are stacked on top of each other, and the plurality of chips include a first chip and a second chip. The first bidirectional switch and the second bidirectional switch are respectively disposed on the first chip and the second chip. The first and the second bidirectional switches respectively receive one of a switch signal and an opposite switch signal as to determine whether to transmit an input signal of the first chip or the second chip to an output terminal. The TSVs respectively pass through a silicon substrate to transmit signals between the plurality of chips.

The plurality of data path modules are disposed in all chips. Each transmission path module includes at least two data path circuits having a same input terminal. The input terminals of each of the data path modules is connected to the output terminals of the first bidirectional switch and the second bidirectional switch respectively as to receive the input signal or receive an output signal from a previous-stage chip, and an output terminal of each of the data path circuits in each of the data path modules is connected to terminals of the at least two TSVs leading to a next-stage chip in a corresponding chip, so as to transmit data through the TSVs according to one of the switch signal and the opposite switch signal. The plurality of output logical circuits are respectively disposed on all chips. The input terminals are of the output logical circuits is connected to terminals of the TSVs at the same side in said all chips to receive at least two transmission signals and respectively generate the output signals.

In one embodiment, each data path circuit includes an input driving circuit, a short-circuit detection circuit and a leakage current cancellation circuit. The input driving circuit receives the input signal, converts the input signal into a pending signal according to a first level voltage and a second level voltage, and transmits the pending signal to a corresponding terminal of the corresponding TSV. The short-circuit detection circuit connects the corresponding terminal of the TSV to detect whether short-circuit on the TSV and a silicon substrate is present according to the input signal, a level of the corresponding terminal of the TSV and one of the opposite switch signal and the switch signal and generate a short-circuit detection output signal. The leakage current cancellation circuit connects the short-circuit detection circuit and the input driving circuit to avoid a leakage current generated by the first level voltage to flow into the silicon substrate according to the short-circuit detection output signal.

In one embodiment, the TSV bidirectional repair circuit of the present embodiment utilizes two bidirectional switches, one of a switch signal and an opposite switch signal to transmit data bidirectional in a plurality of chips, and whether short-circuit on a TSV and the silicon substrate is present may be determined according to the input signal, a level of the TSV and one of the switch signal and the opposite switch signal. Also, once short-circuit on the TSV is present, the TSV bidirectional repair circuit may turn off the power voltage and/or connect the TSV to the ground voltage, so as to avoid the leakage current to flow into the silicon substrate thereby preventing the voltage level in the silicon substrate to shift. Each of the output logical circuits may also self-repair the output signals into correct ones according to a plurality of transmission signals already transmitted, which allows the semiconductor device (e.g., 3DIC) to transmit data correctly and bidirectional even if a partial of the TSVs is in a short-circuit condition.

To make the above features of the disclosure more comprehensible, several embodiments accompanied with drawings are described in detail as follows.

DETAILED DESCRIPTION OF THE EMBODIMENTS

Figure 1:
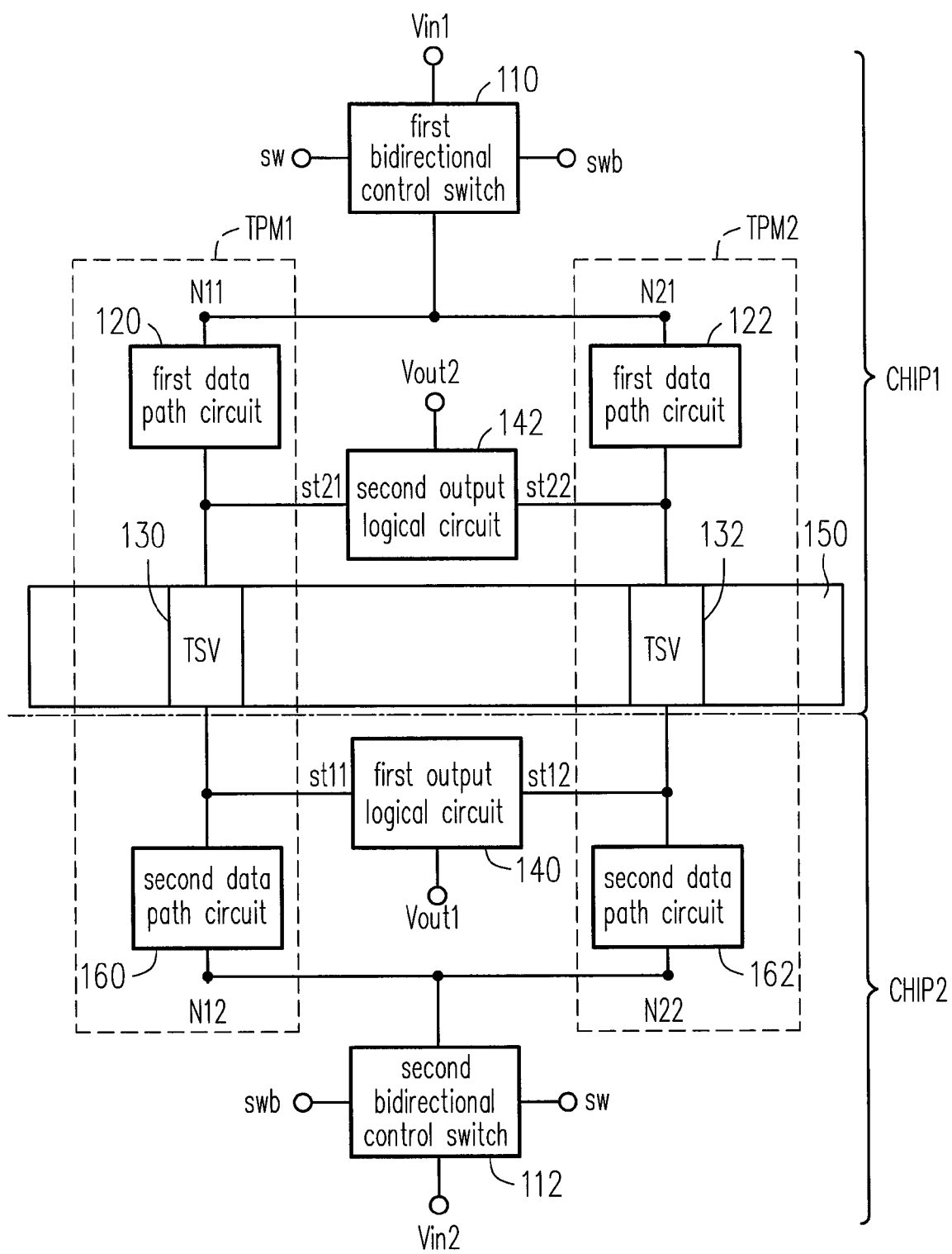
FIG. 1 is a schematic view illustrating a through silicon via (TSV) bidirectional repair circuit of a semiconductor device according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The disclosure is directed to a through silicon via (TSV) bidirectional repair circuit adapted for semiconductor device, which may control data flow between two chips, automatically detect whether a TSV has short-circuit to avoid the leakage current from flowing into a silicon substrate and self-repair a correct output signal based on the signals already transmitted, such that a 3DIC may transmit data correctly and bidirectionally.

FIG. 1 is a schematic view illustrating a through silicon via (TSV) bidirectional repair circuit 100 of a semiconductor device according to a first embodiment of the disclosure. As shown in FIG. 1, the TSV bidirectional repair circuit 100 adapted to a semiconductor device includes at least two chips CHIP1 and CHIP2 stacked on top of each other, a first bidirectional switch 110 and a second bidirectional switch 112, at least two transmission path modules TPM1 and TPM2, a first output logical circuit 140 and a second output logical circuit 142.

Despite that the first chip CHIP1 and the second chip CHIP2 are disclosed as being stacked on top of each other in FIG. 1, the disclosure may also be implemented with a semiconductor device (e.g., three dimensional chip) formed by a plurality of chips stacked on top of each other while having two chips for transmitting data to be used respectively as the first chip CHIP1 and the second chip CHIP2, whereas other chips with one or more layers may also be provided between the first chip CHIP1 and the second chip CHIP2.

The first bidirectional switch 110 is disposed on the first chip CHIP1 and the second bidirectional switch 112 is disposed on the second chip CHIP2. According to the an embodiment, a transmission direction of signals may be selected by a switch signal sw or an opposite switch signal swb. That is, in the embodiment, an input signal Vin1 of the first chip CHIP1 may be transmitted to the first output logical circuit 140 of the second chip CHIP2, or an input signal Vin2 of the second chip CHIP2 may be transmitted to the second output logical circuit 142 of the first chip CHIP1, selectively. Since the TSV bidirectional repair circuit 100 is not capable of performing a bidirectional transmission to the input signal Vin1 and the input signal Vin2 at the same time, thus when the input signal Vin1 is selected for transmission, the first bidirectional switch 110 may be turned on to transmit the input signal Vin1 to an output terminal of the first bidirectional switch 110. The second bidirectional switch 112 may be turned off to avoid the input signal Vin2 from being transmitted to an output terminal of the second bidirectional switch 112. Alternatively, when the input signal Vin2 is selected for transmission, the first bidirectional switch 110 may be turned off and the second bidirectional switch 112 may be turned on, so as to transmit the input signal Vin2 to the output terminal of the second bidirectional switch 112.

The at least two transmission path module of the embodiment are illustrated by using transmission path modules TPM1 and TPM2 as shown in FIG. 1. However, the embodiment may be implemented by using other transmission path modules additionally, so as to improve accuracy of a bidirectional data transmission. A first terminal (N11 and N21) of two terminals in each of the transmission path modules TPM1 and TPM2 is connected to the output terminal of the first bidirectional switch 110, a second terminal (N12 and N22) of two terminals in each of the transmission path modules TPM1 and TPM2 is connected to the output terminal of the second bidirectional switch 112. Each of the transmission path modules TPM1 and TPM2 includes at least one TSV (130 and 132). The TSVs 130 and 132 respectively pass through a silicon substrate 150 to transmit signals between the first chip CHIP1 and the second chip CHIP2. In case, when the disclosure is implemented with the semiconductor device (e.g., three dimensional chip (3DIC)) formed by the plurality of chips stacked on top of each other, the TSVs 130 and 132 may respectively pass through a silicon substrate with a corresponding number of layers located between the first chip CHIP1 and the second chip CHIP2. After each of the transmission path modules TPM1 and TPM2 is informed of the transmission direction of signals through the switch signal sw, the input signal Vin1 of the first chip CHIP1 or the input signal Vin2 of the second chip CHIP2 may be transmitted to another chip through the TSVs 130 and 132.

General application of the embodiment may transmit data by using one single transmission path module (TPM1 or TPM2) including one single TSV (130 or 132). Due to difference in process yield, a sidewall of one single TSV is prone to break and invaded by foreign impurity, such that data may be electrically connected to the silicon substrate 150 when passing through the TSV, and resulting an unstable data transmission. Therefore, the embodiment may be implemented by using one single transmission path module (TPM1 or TPM2) having one or more TSVs (e.g., more than two TSVs) according to practical can be for a stable data transmission. For instance, the transmission path module TPM1 may include a plurality of TSVs 130 for transmitting data at the same time.

The first output logical circuit 140 and the second output logical circuit 142 are respectively disposed on the second chip CHIP2 and the first chip CHIP1. Input terminals of the first output logical circuit 140 and the second output logical circuit 142 are respectively connected to second terminal and first terminal of the TSVs 130 and 132 to respectively receive at least two first transmission signals and at least two second transmission signals, so as to respectively generate a first output signal and a second output signal. The input terminal of the first output logical circuit 140 is connected to the second terminal of the TSV (130 or 132) located at the second chip CHIP2, once the input signal Vin1 is transmitted from the first chip CHIP1 to the second chip CHIP2, the first output logical circuit 140 may receive the at least two first transmission signals (e.g., the first transmission signals st11 and st12) respectively through the TSV (130 or 132) of the transmission path module (TPM1 and TPM2) and generate the first output signal Vout1 according to the first transmission signals st11 and st12. The input terminal of the second output logical circuit 142 connects to the first terminal of the TSV (130 or 132) located at the first chip CHIP1, once the input signal Vin2 is transmitted from the second chip CHIP2 to the first chip CHIP1, the second output logical circuit 142 may receive the at least two second transmission signals (e.g., the second transmission signals st21 and st22) respectively through the TSV (130 or 132) of the transmission path module (TPM1 or TPM2) and generate a second output signal Vout2 according to the second transmission signals st21 and st22. When other transmission path modules are used to improve accuracy in transmission, a number of the input terminals of the first output logical circuit 140 is equal to a number of the transmission path modules, such that the first transmission signal Vout1 may be calculated by a corresponding number of the first transmission signals respectively received from the second terminals of the TSVs located at the second chip CHIP2 in the transmission path modules; and the second transmission signal Vout2 may be calculated by a corresponding number of the second transmission signals respectively received from the first terminals of the TSVs located at the first chip CHIP1 in the transmission path modules.

The transmission path modules TPM1 and TPM2 and inner devices therein are described as below. Referring to FIG. 1, the transmission path module (TPM1 or TPM2) includes at least one TSV (130 or 132), a first data path circuit (120 or 122) and a second data path circuit (160 or 162). The first data path circuit (120 or 122) is disposed on the first chip CHIP1 and the second data path circuit (160 or 162) is disposed on the second chip CHIP2. An input terminal (N11 or N21) of the first data path circuit (120 or 122) is connected to the output terminal of the first bidirectional switch 110 to receive the input signal Vin1 of the first chip CHIP1. An input terminal (N12 or N22) of the second data path circuit (160 or 162) is connected to the output terminal of the second bidirectional switch 112 to receive the input signal Vin2 of the second chip CHIP2. The output terminal of the first data path circuit (120 or 122) is respectively connected to the first terminal of the TSV (130 or 132) located at the first chip CHIP1, whereas the output terminal of the second data path circuit (160 or 162) is respectively connected to the second terminal of the TSV (130 or 132) located at the second chip CHIP2. Accordingly, the first data path circuit (120 or 122) and the second data path circuit (160 or 162) in the transmission path module (TPM1 or TPM2) may respectively transmit data bidirectionally through the TSV (130 or 132) according to the transmission direction of signals determined by the switch signal sw.

Figure 2:
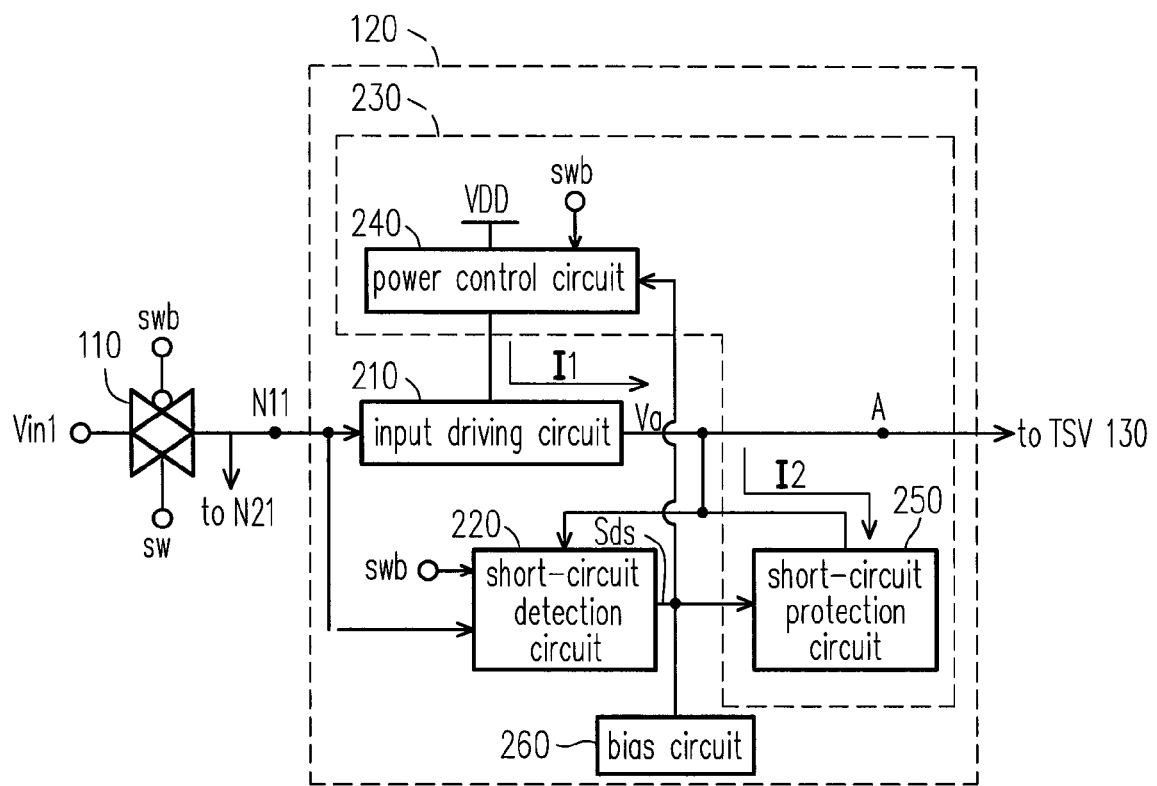
FIG. 2 is a functional block view illustrating the first bidirectional switch and the first data path circuit depicted in FIG. 1.

In FIG. 1, the first data path circuits 120 and 122 and the second data path circuits 160 and 162 are of a similar circuit structure. Therefore, according to the embodiment, the first data path circuit 120 depicted in FIG. 1 is described in detail, other data path circuits 122, 162 and 162 may be implemented with reference to the first data path circuit 120. FIG. 2 is a functional block view illustrating the first bidirectional switch 110 and the first data path circuit 120 depicted in FIG. 1.

Referring to FIG. 2, in the first bidirectional switch 110, the switch signal sw is received by the first bidirectional switch 110 to determine whether to transmit the input signal Vin1 of the input terminal of the first bidirectional switch 110 to the output terminal of the first bidirectional switch 110. In the disclosure, the transmission direction of signals in which the input signal Vin1 is transmitted from the first chip CHIP1 to the second chip CHIP2 is named as a forward direction signal transmission; and the transmission direction of signals in which the input signal Vin2 is transmitted from the second chip CHIP2 to the first chip CHIP1 is named as a backward direction signal transmission. The first data path circuit 120 includes an input driving circuit 210, a short-circuit detection circuit 220, a leakage current cancellation circuit 230 and a bias circuit 260. During the forward direction signal transmission, the input driving circuit 210 may receive the input signal Vin1 through the input terminal N11 and convert the input signal Vin1 into a pending signal Va according to a first level voltage (e.g., power voltage VDD) and a second level voltage (e.g., ground voltage GND) while increasing the driving capability of the pending signal Va, and transmit the pending signal Va to a corresponding terminal (a terminal A depicted in FIG. 2) of the TSV 130 located at the first chip CHIP1. The driving capability of the pending signal Va is increased to avoid data error due to fade-out of signals during the transmission. In addition, a voltage level of the first level voltage (the power voltage VDD) is greater than a voltage level of the second level voltage (the ground voltage GND).

The short-circuit detection circuit 220 is connected to the corresponding terminal A of the TSV 130 located at the first chip CHIP1 to detect whether short-circuit on the TSV 130 and the silicon substrate 150 depicted in FIG. 1 is present according to the input signal Vin1, the switch signal sw and a level of the corresponding terminal A of the TSV 130, so as to generate a short-circuit detection output signal Sds. In the present embodiment, the short-circuit detection circuit 220 is utilized to automatically detect whether short-circuit on the TSV 130 and the silicon substrate 150 is present, and the switch signal sw is used to determine the transmission direction of signals, so as to determine whether to enable the short-circuit detection output signal Sds. During the forward direction signal transmission, if the TSV 130 is finely manufactured while short-circuit on the TSV 130 and the silicon substrate 150 is not present, the short-circuit detection output signal Sds may be disabled so the power voltage VDD may be constantly provided to the input driving circuit 210. However, if an insulating layer of the TSV 130 is broken or invaded by foreign impurity during manufacturing process, resulting short-circuit on the TSV 130 and the silicon substrate 150 is present in the first chip CHIP1 where the TSV 130 is located on, the short-circuit detection output signal Sds may be enabled so the leakage current cancellation circuit 230 may be informed to avoid leakage current to flow into the silicon substrate.

The leakage current cancellation circuit 230 is connected to the short-circuit detection circuit 220 and the input driving circuit 210 and configured to avoid the leakage current generated by the first level voltage (the power voltage VDD) to flow into the silicon substrate 150 according to the short-circuit detection output signal Sds. In other words, when the short-circuit detection circuit 220 determines that the short-circuit detection output signal Sds is enabled due to short-circuit on the TSV 130 and the silicon substrate 150, the leakage current cancellation circuit 230 may turn off the power voltage VDD through a power control circuit 240, so as to avoid generating a leakage current I1 to flow into the input driving circuit 210. The leakage current cancellation circuit 230 may also quickly connect the corresponding terminal A of the TSV 130 to the ground voltage GND through the short-circuit protection circuit 250 and direct a leakage current I2 to the ground terminal to avoid the leakage current I2 to flow into the silicon substrate, so as to prevent the voltage level in the silicon substrate 150 to shift. In addition, the bias circuit 260 is connected to the short-circuit detection circuit 220 and the leakage current cancellation circuit 230 to maintain a bias voltage of the short-circuit detection output signal Sds.

In the embodiment, the leakage current cancellation circuit 230 of FIG. 2 includes the power control circuit 240 and/or the short-circuit protection circuit 250, said two circuits may be implement together or may be one at the time. The power control circuit 240 of the first data path circuit (120 or 122) in FIG. 1 is connected to the short-circuit detection circuit 220 to receive the short-circuit detection output signal Sds and determine whether to stop providing the first level voltage (the power voltage VDD) to the input driving circuit 210 according to the short-circuit detection output signal Sds and the opposite switch signal swb. In other words, during the forward direction signal transmission and when short-circuit on the corresponding TSV 130 and the silicon substrate is determined by the short-circuit detection circuit 220, the power control circuit 240 may stop providing the first level voltage (the power voltage VDD) to the input driving circuit 210 so the leakage current I1 generated by the power voltage VDD and the input driving circuit 210 during the signal transmission may also be stopped from being provided to the TSV 130. Once the power control circuit 240 is informed of being in the backward direction signal transmission by the opposite switch signal swb, this indicates that input signal Vin1 is not required to be transmitted by the first data path circuit 120, so that the power control circuit 240 may stop providing the first level voltage (the power voltage VDD) to the input driving circuit 210 accordingly.

The short-circuit protection circuit 250 is connected to the short-circuit detection circuit 220 and the corresponding terminal A of the TSV 130, which determines whether to turn on the corresponding terminal A of the TSV 130 to the ground voltage GND according to the short-circuit detection output signal Sds. In other words, during the forward direction signal transmission and when short-circuit on the TSV 130 and the silicon substrate is determined by the short-circuit detection circuit 220 (the short-circuit detection output signal Sds is enabled), the short-circuit protection circuit 250 may turn on the corresponding terminal A of the TSV 130 to the ground voltage GND so that the leakage current I2 generated by the power voltage VDD may be directed to the ground terminal through the short-circuit protection circuit 250, so as to avoid the leakage current I2 to flow into the silicon substrate 150 where the TSV 130 is located. During the backward direction signal transmission, the short-circuit detection circuit 220 may disable the short-circuit detection output signal Sds to avoid a situation in which the input signal Vin2 cannot be transmitted to the first chip CHIP1 through the TSV 130, and the short-circuit protection circuit 250 may turn off the corresponding terminal A of the TSV 130 to the ground voltage GND accordingly.

The short-circuit detection circuit 220 and the power control circuit 240 may further determine the transmission direction of signals according to the opposite switch signal swb and the switch signal sw. The short-circuit detection circuit 220 and the power control circuit 240 in the first data path circuit (120 or 122) performs said determination of the transmission direction of signals according to the opposite switch signal swb, whereas the short-circuit detection circuit 220 and the power control circuit 240 in the second data path circuit (160 or 162) perform said determination of the transmission direction of signals according to the switch signal sw. In the short-circuit detection circuit 220 of the first data path circuit (120 or 122) depicted in FIG. 1, during the backward direction signal transmission, since it is not required for the first data path circuit (120 and 122) to transmit the input signal Vin1, the power voltage VDD is not provided to input driving circuit 210 by the power control circuit 240, and the short-circuit detection circuit 220 of the first data path circuit (120 or 122) may control the short-circuit protection circuit 250 to turn off the first terminal of the TSV (130 or 132) to the ground terminal. Alternatively, in the short-circuit detection circuit 220 of the second data path circuit (160 or 162) depicted in FIG. 1, during the forward direction signal transmission, since it is not required for the second data path circuit (160 or 162) to transmit the input signal Vin2, the power voltage VDD is not provided to input driving circuit 210 by the power control circuit 240, and the short-circuit detection circuit 220 of the second data path circuit (160 or 162) may control the short-circuit protection circuit 250 to turn off the corresponding terminals (i.e., the second terminal) of the TSV (130 or 132) to the ground terminal.

Figure 3:
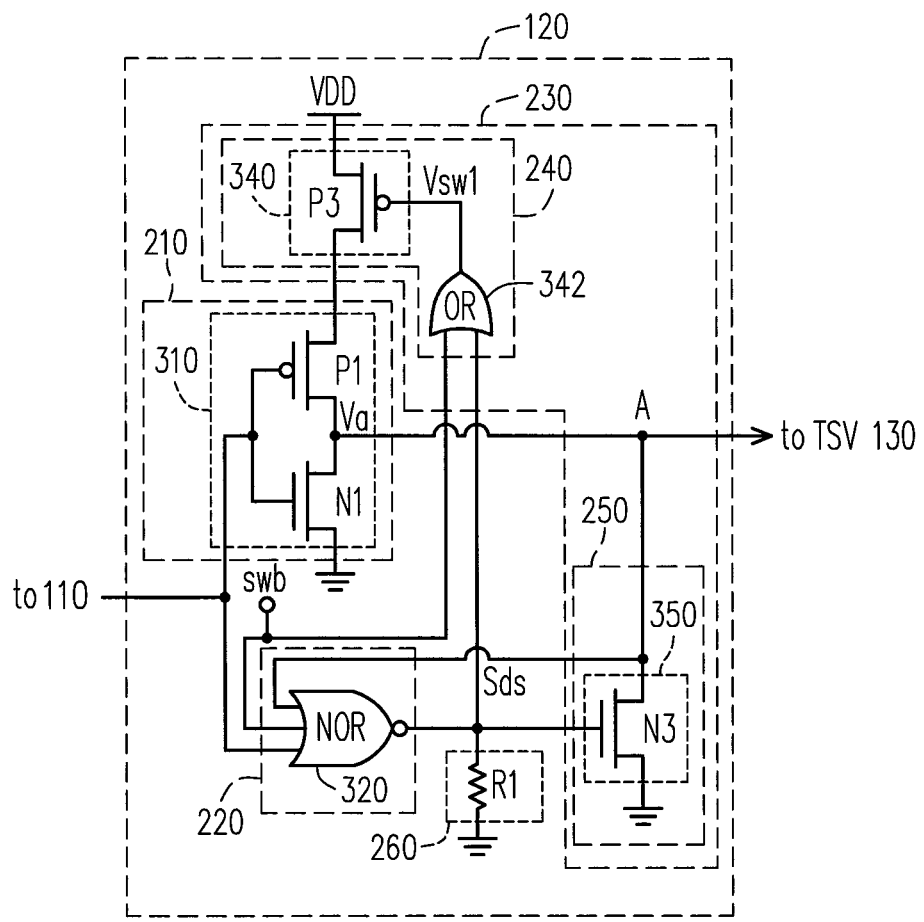
FIG. 3 is a circuit diagram illustrating the first data path circuit depicted in FIG. 2.

FIG. 3 illustrates a circuit diagram of the data path circuit 120 depicted in FIG. 2. In other words, FIG. 3 illustrates each circuit structure of elements in the first data path circuit 120 depicted in FIG. 2. In FIG. 1, the data path circuits 120, 122, 160 and 162 all have a similar circuit structure, thus inner devices of the first data path circuit 120 is described hereinafter as an example. Referring to FIG. 3, the input driving circuit 210 includes a signal inverter 310 configured as an input stage circuit. The signal inverter 310 includes a N-type metal oxide semiconductor field effect transistor (MOSFET) N1 and a P-type metal oxide semiconductor field effect transistor P1. Control terminals (gate terminals) of the transistors N1 and P1 are connected to the output terminal of the first bidirectional switch 110 to receive the input signal Vin1 and configured as a first terminal of the signal inverter 310. The P-type transistor P1 has a first terminal (source terminal) to receive the first level voltage (e.g., the power voltage VDD) from the power control circuit 240 and configured as a power terminal of the signal inverter 310. A second terminal (drain terminal) of P-type transistor P1 is connected to a first terminal (drain terminal) of the N-type transistor N1 and configured as an output terminal of the signal inverter 310. The output terminal of the signal inverter 310 is connected to the corresponding terminal of (the terminal A depicted in FIG. 3) of the TSV 130. The N-type transistor N1 has a second terminal (source terminal) to receive the ground voltage GND. Therefore, the pending signal Va is opposite to the input signal Vin1.

The short-circuit detection circuit 220 includes a NOR gate 320 (i.e., the first NOR gate) having a first input terminal connected to a first terminal (the terminal A) of the TSV 130, a second input terminal to receive the input signal Vin1, a third input terminal to receive the opposite switch signal swb and an output terminal to generate the short-circuit detection output signal Sds.

The bias circuit 260 has a first terminal connected to the output terminal of the short-circuit detection circuit 220 (i.e., the output terminal of the NOR gate 320) to maintain the bias voltage of the short-circuit detection output signal Sds. In the embodiment, the bias circuit 260 includes a bias resistor R1 having a first terminal connected to the output terminal of the short-circuit detection circuit 220 and a second terminal to receive the second level voltage (the ground voltage GND).

Figure 4A:
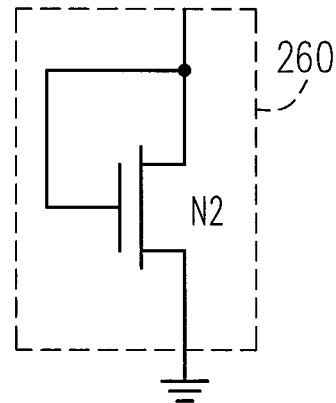
FIG. 4A and FIG. 4B are circuit diagrams illustrating the bias circuit depicted in FIG. 3 according to other embodiments.
Figure 4B:
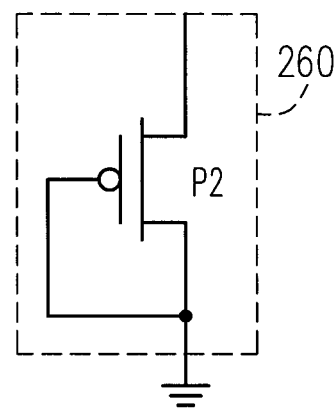

In the embodiment, the bias circuit 260 may also be disposed by utilizing a P-type metal oxide semiconductor field effect transistor and N-type metal oxide semiconductor field effect transistor, or the bias circuit 260 may not be disposed at all. FIG. 4A and FIG. 4B are circuit diagrams illustrating the bias circuit 260 depicted in FIG. 3 according to other embodiments. The bias circuit 260 of FIG. 4A includes a N-type transistor N2 having a drain terminal and a gate terminal which are connected to the output terminal of the short-circuit detection circuit 220 depicted in FIG. 3 and a source terminal to receive the ground voltage GND, so that the bias circuit 260 may have a sufficient bias resistance. The bias circuit 260 of FIG. 4B includes a P-type transistor P2 having a source terminal connected to the output terminal of the short-circuit detection circuit 220 depicted in FIG. 3 and a drain terminal and a gate terminal to receive the ground voltage GND, so that the bias circuit 260 may have a sufficient bias resistance.

Referring back to FIG. 3, the power control circuit 240 includes a first switch 340 and a OR gate 342. The OR gate 342 has a first input terminal to receive the opposite switch signal swb, a second input terminal to receive short-circuit detection output signal Sds and an output terminal to generate a first-switch switch signal Vsw1. On the other hand, the first switch 340 of the embodiment is implemented by using a P-type metal oxide semiconductor field effect transistor (MOSFET) P3. The P-type transistor P3 has a source terminal to receive the power voltage VDD, a drain terminal connected to the power terminal of the input driving circuit 210 and a gate terminal to receive the first-switch switch signal Vsw1.

The short-circuit protection circuit 250 includes a second switch 350, which is implemented by using a N-type metal oxide semiconductor field effect transistor N3 in the embodiment. The N-type transistor N3 has a drain terminal connected to the first terminal (the terminal A) of the TSV 130, a source terminal connected to the ground voltage GND and a gate terminal to receive the short-circuit detection output signal Sds. The second switch 350 determines whether to turn on the first terminal of the TSV 130 to the ground voltage GND.

In view of above, operating steps for the circuit structures in the first data path circuit 120 depicted in FIG. 3 of the disclosure may be described with a truth table as Table (1) below:

TABLE (1)

| Status | sw | swb | TSV 130 | Vin1 | Va (A) | Sds | Vsw1 | N3 | P3 |
|---|---|---|---|---|---|---|---|---|---|
| 1 | 0 | 1 | — | — | — | 0 | 1 | turned off | turned off |
| 2 | 1 | 0 | normal | 0 | 1 | 0 | 0 | turned off | turned on |
| 3 | 1 | 0 | normal | 1 | 0 | 0 | 0 | turned off | turned on |
| 4 | 1 | 0 | short-circuit | 0 | 0 (short-circuit) | 1 | 1 | turned on | turned off |
| 5 | 1 | 0 | short-circuit | 1 | 0 (short-circuit) | 0 | 0 | turned off | turned on |

Referring to FIGS. 1, 3 and Table (1) together. Status 1 indicates that the input signal Vin2 is transmitted from the second chip CHIP2 to the first chip CHIP1 (the backward direction signal transmission), the switch signal sw is logical "0", and the opposite switch signal swb is logical "1". In this case, based on the opposite switch signal swb being logical "1", the short-circuit detection output signal Sds generated by the NOR gate 320 of the short-circuit detection circuit 220 is logical "0", thus the N-type transistor N3 of the second switch 350 is turned off, so as to avoid the terminal A of the TSV 130 to be turned on to the ground voltage. Further, since the first-switch switch signal Vsw1 generated by the OR gate 342 of the power control circuit 240 becomes logical "1", the P-type transistor P3 of the first switch 340 may be turned off accordingly, so as to avoid the power voltage VDD to be transmitted to the input driving circuit 240.

Statuses 2 to 5 indicate that the input signal Vin1 is transmitted from the first chip CHIP1 to the second chip CHIP2 (the forward direction signal transmission), the switch signal sw is logical "1", and the opposite switch signal swb is logical "0". In which, statuses 2 to 3 indicate that the TSV 130 is in normal condition, which means the TSV 130 has no short-circuit on the silicon substrate.

In status 2, the input signal Vin1 is logical "0", the pending signal Va becomes logical "1" based on the signal inverter 310, so that the short-circuit detection output signal Sds generated by the NOR gate 320 of the short-circuit detection circuit 220 is logical "0", thus the N-type transistor N3 of the second switch 350 may be turned off accordingly. Since the first-switch switch signal Vsw1 generated by the OR gate 342 of the power control circuit 240 becomes logical "0", the P-type transistor P3 of the first switch 340 may be turned on accordingly to constantly provide the power voltage VDD to the input driving circuit 210.

In status 3, the input signal Vin1 is logical "1", the pending signal Va becomes logical "0" based on the signal inverter 310, the short-circuit detection output signal Sds generated by the NOR gate 320 of the short-circuit detection circuit 220 is logical "0", thus the N-type transistor N3 of the second switch 350 may be turned off accordingly. Since the first-switch switch signal Vsw1 generated by the OR gate 342 of the power control circuit 240 becomes logical "0", the P-type transistor P3 of the first switch 340 may be turned on accordingly. Therefore, the pending signal Va in the statuses 2 and 3 may be transmitted normally to the first output logical circuit 140 depicted in FIG. 1 through the TSV 130 and used as the first transmission signal st11.

Statuses 4 to 5 indicate that the TSV 130 is in the short-circuit condition, which means short-circuit o the TSV 130 and the silicon substrate is present. In status 5, the input signal Vin1 is logical "1" and since the pending signal Va originally being logical "0" is still logical "0" after passing through short-circuit on TSV 130, thus it is the same as in status 3, in which the transistor N3 is turned off and the transistor P3 is turned on.

In status 4, although the input signal Vin1 is logical "0", the pending signal Va originally being logical "1" changes to logical "0" due to short-circuit on the TSV 130. Therefore, the short-circuit detection output signal Sds generated by the NOR gate 320 of the short-circuit detection circuit 220 becomes logical "1" so the N-type transistor N3 of the second switch 350 is turned on accordingly, which allows the leakage current to be directed to the ground voltage through the terminal A of the TSV 130. However, since the first transmission signal st11 transmitted to the first output logical circuit 140 through the TSV 130 becomes logical "0", the first transmission signal st11 may not be correctly transmitted to the first output logical circuit 140. Despite that the first data path circuit 120 of FIG. 3 may not perform a correct data self-repair operation for status 4 as shown in Table (1), above problems may be solved by using two or more of the transmission path modules TPM1 and TPM2 depicted in FIG. 1.

Figure 5:
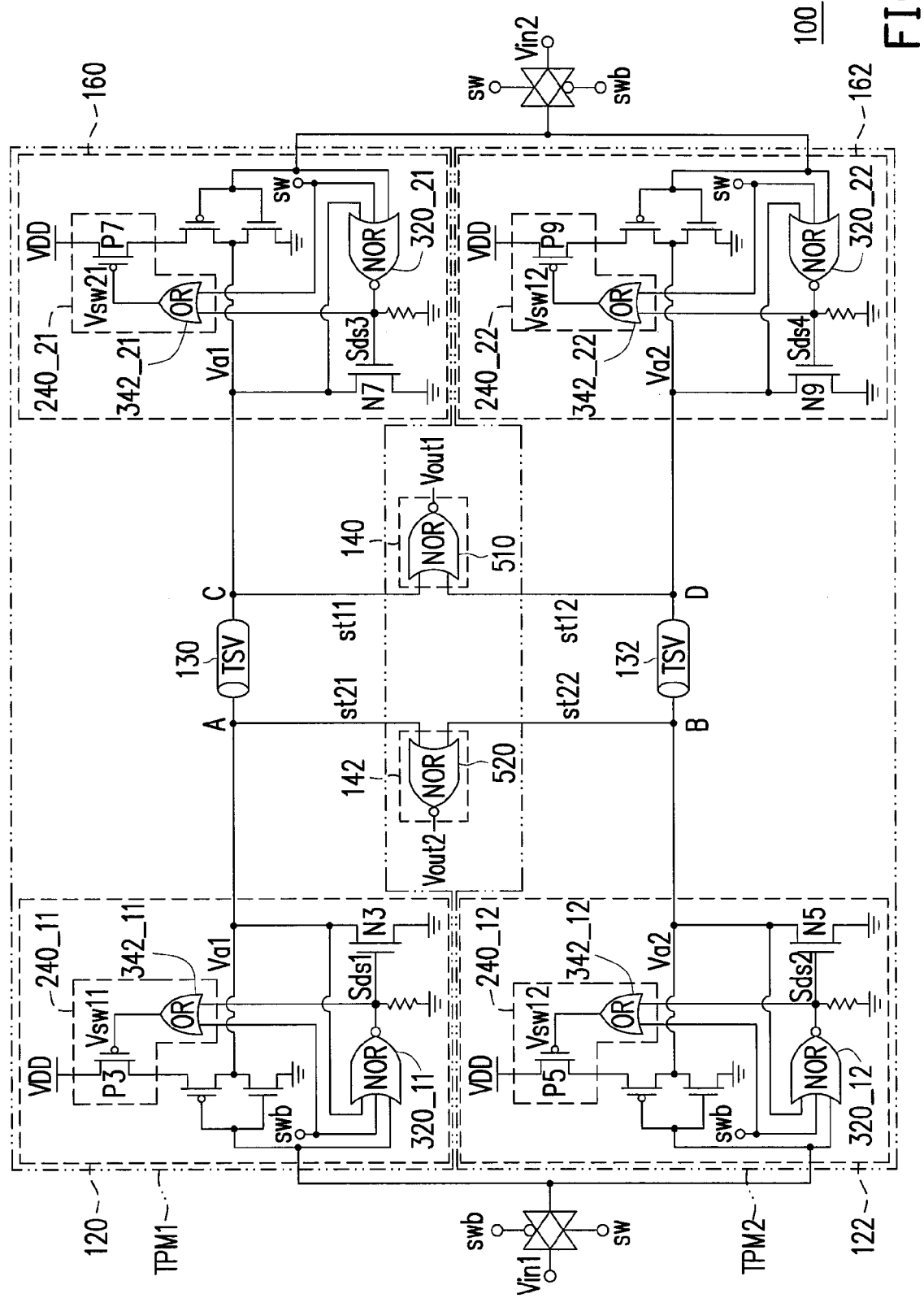
FIG. 5 is a circuit diagram illustrating a through silicon via (TSV) bidirectional repair circuit of a semiconductor device according to a first embodiment of the disclosure.

FIG. 5 is a circuit diagram illustrating a TSV bidirectional repair circuit 100 according to a first embodiment of the disclosure. In other words, FIG. 5 illustrates circuit structures of all devices in FIG. 1. Since the first data path circuits 120 and 122 illustrated in FIG. 5 are identical to the first data path circuit 120 illustrated in FIG. 3, thus the operating mechanism thereof is omitted herein. In FIG. 5, a difference between the second data path circuits 160 and 162 and the first data path circuits 120 and 122 lies where: An input terminal of OR gate (342_21 or 342_22) of the power control circuits (240_21 or 240_22) in the second data path circuit (160 or 162) receives the switch signal sw instead of the opposite switch signal swb, so that during the forward signal transmission, the power control circuit (240_21 or 240_22) may stop providing the power voltage VDD to a corresponding input driving circuit accordingly. An input terminal of the NOR gate (320_21 or 320_22) of the short-circuit detection circuit (220_21 or 220_22) in the second data path circuit (160 or 162) receives the switch signal sw instead of the opposite switch signal swb, so that during the forward signal transmission, the short-circuit detection output signal (Sds3 or Sds4) may be disabled to avoid second terminal (C or D) of the TSV (130 or 132) to be turned on the ground voltage through the transistor (N7 or N9).

FIG. 5 is provided with two of the transmission path modules TPM1 and TPM2. Thus the first output logical circuit 140 includes a NOR gate 510 (i.e., the second NOR gate). During the forward direction signal transmission, a first input terminal and a second input terminal of the NOR gate 510 may respectively receive the first transmission signal (st11 or st12) from the first data path circuit (120 or 122) through the second terminal (C or D) of the TSV (130 or 132). With signal processing mechanism of the NOR gate 510, the first output signal Vout1 may be correctly self-repaired, so that the input signal Vin1 may be transmitted from the first chip CHIP1 to the second chip CHIP2. The second output logical circuit 142 includes a NOR gate 520 (i.e., the third NOR gate). During the backward direction signal transmission, a first input terminal and a second terminal of the NOR gate 520 may respectively receive the second transmission signal (st21 or st22) respectively from the first data path circuit (160 or 162) through first terminals (A or B) of the TSV (130 or 132). With signal processing mechanism of the NOR gate 520, the second output signal Vout2 may be correctly self-repaired, so that the input signal Vin2 may be transmitted from the second chip CHIP2 to the first chip CHIP1.

Operating steps for the circuit structures in the TSV bidirectional repair circuit 100 depicted in FIG. 5 of the disclosure may be described with a truth table as Table (2) below: The transmission direction of signal herein is set to transmit from the first chip CHIP1 to the second chip CHIP2 (i.e., the forward direction signal transmission), so that the switch signal is logical "1" and the opposite switch signal is logical "0".

the terminal C are of the same level. The pending signal Va2 located at the terminal B of the TSV 132 and the first transmission signal st12 located at the terminal D are also of the same level.

According to status 1 in Table (2), the input signal Vin1 is logical "0" and the pending signals Va1 and Va2 are opposite to the input signal Vin1 being logical "1". The short-circuit detection output signals Sds1 and Sds2 generated by the NOR gates 320_11 and 320_12 of the short-circuit detection circuits 220_11 and 220_12 are both logical "0". The transistors P3 and P5 are respectively turned on to provide the power voltage VDD, and the transistors N3 and N5 are turned off. Since the first transmission signals st11 and st12 are logical "1", the NOR gate 510 of the first output logical circuit 140 changes the first output signal Vout1 to logical "0".

According to status 2 in Table (2), the input signal Vin1 is logical "1" and the pending signals Va1 and Va2 are both logical "0". The short-circuit detection output signals Sds1 and Sds2 are both logical "0". The transistors P3 and P5 are respectively turned on to provide the power voltage VDD, and the transistors N3 and N5 are turned off. Since the first transmission signals st11 and st12 are logical "0", the NOR gate 510 of the first output logical circuit 140 changes the first output signal Vout1 to logical "1".

Statuses 3 to 4 indicate that the TSV 130 is in the short-circuit condition with the silicon substrate and the TSV 132 is in the normal condition. In status 3, the input signal Vin1 is logical "0", the pending signal Va2 is logical "1", but the pending signal Va1 is logical "0" due to short-circuit on the TSV 130. In this case, the short-circuit detection output signal Sds1 is logical "1" and the short-circuit detection output signal Sds2 is logical "0". The transistor N3 is turned on so the first terminal A of the TSV 130 is turned on to ground voltage, so as to direct the leakage current to the ground terminal. The transistor P3 is turned off to stop providing the power voltage VDD so the input signal Vin1 may not be transmitted by the

TABLE (2)

| Status | TSV 130 | TSV 132 | Vin1 | Va1 (A) | Va2 (B) | Vout1 | N3 | P3 | N5 | P5 |
|---|---|---|---|---|---|---|---|---|---|---|
| 1 | normal | normal | 0 | 1 | 1 | 0 | turned off | turned on | turned off | turned on |
| 2 | normal | normal | 1 | 0 | 0 | 1 | turned off | turned on | turned off | turned on |
| 3 | short-circuit | normal | 0 | 0 (short-circuit) | 1 | 0 | turned on | turned off | turned off | turned on |
| 4 | short-circuit | normal | 1 | 0 (short-circuit) | 0 | 1 | turned off | turned on | turned off | turned on |
| 5 | normal | short-circuit | 0 | 1 | 0 (short-circuit) | 0 | turned off | turned on | turned on | turned off |
| 6 | normal | short-circuit | 1 | 0 | 0 (short-circuit) | 1 | turned off | turned on | turned off | turned on |
| 7 | short-circuit | short-circuit | 0 | 0 (short-circuit) | 0 (short-circuit) | 1 | turned on | turned off | turned on | turned off |
| 8 | short-circuit | short-circuit | 1 | 0 (short-circuit) | 0 (short-circuit) | 1 | turned off | turned on | turned off | turned on |

Based on the switch signal sw being logical "0", the short-circuit detection output signal (Sds3 or Sds4) of the second data path circuit (160 or 162) becomes logical "0", the N-type transistor (N7 or N9) is turned off accordingly, so as to avoid the terminal (C or D) of the TSV (130 or 132) to be turned on to ground voltage. The transistor (P7 or P9) is also turned off to avoid the second data path circuit (160 or 162) from transmitting the input signal Vin2.

Referring to FIG. 5 and Table (2) together, statuses 1 and 2 indicate that the TSVs 130 and 132 are both in the normal condition. The pending signal Va1 located at the terminal A of the TSV 130 and the first transmission signal st11 located at first data path circuit 120. The transistor P5 may provide the power voltage VDD while the transistor N5 is turned off. Since the first transmission signals st11 and st12 are respectively being logical "0" and logical "1", signal processing mechanism of the NOR gate of the first output logical circuit 140 may be used to automatically repair the first output signal Vout1 to logical "0" (which is identical to the input signal Vin1). In status 4, the input signal Vin1 is logical "1" and the pending signal Va2 is logical "0". The pending signal Va1 is logical "0" regardless of whether the TSV 130 is in the short-circuit condition. In this case, actuation in status 4 is identical to that of status 2 while the first output logical circuit 140 may generate the correct first output signal Vout1 (logical "1"), thus related description is omitted herein.

Statuses 5 to 6 indicate that the TSV 130 is in the normal condition and the TSV 132 is in the short-circuit condition with the silicon substrate. In status 5, the input signal Vin1 is logical "0", the pending signal Va1 is logical "1", and the pending signal Va2 is logical "0" due to short-circuit on the TSV 130. In this case, the short-circuit detection output signal Sds1 is logical "0" and the short-circuit detection output signal Sds2 is logical "1". Therefore, the transistor P3 may provide the power voltage VDD while the transistor N3 is turned off. The transistor N5 is turned on so that the first terminal B of the TSV 132 is turned on to ground voltage, so as to direct the leakage current to the ground terminal. The transistor P5 is turned off to stop providing the power voltage VDD so the input signal Vin1 may not be transmitted by the first data path circuit 122. Since the first transmission signals st11 and st12 are respectively being logical "1" and logical "0", signal processing mechanism of the NOR gate 510 of the first output logical circuit 140 may be used to automatically repair the first output signal Vout1 to logical "0" (which is identical to the input signal Vin1). In status 6, the input signal Vin1 is logical "1" and the pending signal Va1 is logical "0". The pending signal Va2 is logical "0" regardless of whether the TSV 132 is in the short-circuit condition. In this case, actuation in status 6 is identical to that of statuses 2 and 4, and the first output logical circuit 140 may generate the correct first output signal Vout1 (logical "1"), thus related description is omitted herein.

Statuses 7 to 8 indicate that the TSVs 130 and 132 are both in the short-circuit condition with the silicon substrate. In status 8, the input signal Vin is logical "1", the pending signal Va1 and Va2 are originally logical "0" which is opposite to the input signal Vin1. Therefore, actuation of the TSV bidirectional repair circuit 100 is identical to that in statuses 2, 4 and 6, and the second output logical circuit 142 may generate a correct first output signal Vout0 (logical "1").

In status 7, since the input signal Vin1 is logical "0", the pending signals Va1 and Va2 and the second transmission signals st21 and st22 are all lower to logical "0" due to short-circuit. The short-circuit detection output signals Sds1 and Sds2 generated by the NOR gate 320_11 and 320_12 are both logical "1" so the transistors P3 and P5 are both turned off to stop providing the power voltage VDD, such that the input signal Vin1 may not be transmitted by the first data path circuits 120 and 122. Accordingly, the transistors N3 and N5 are turned on to direct the leakage current (which is supposed to flow into the TSVs 130 and 132) to the ground terminal. Since the NOR gate 510 of first output logical circuit 140 respectively receive two incorrect first transmission signals st11 and st12 (logical "0"), the NOR gate 510 may not perform the self-repair operation thereby generating an incorrect first output signal Vout1 (logical "1").

Actuating mechanism of the TSV bidirectional repair circuit 100 during the forward direction signal transmission is disclosed in FIG. 5 with reference to the truth Table (2), apply the embodiment may derive that the switch signal sw being logical "0" and the opposite switch signal swb being logical "1" during the backward direction signal transmission based on above the disclosure, so related description to actuating mechanism of the TSV bidirectional repair circuit 100 of FIG. 5 is omitted herein. For instance, based on the opposite switch signal swb being logical "1", the short-circuit detection output signal (Sds1 or Sds2) of the first data path circuit (120 or 122) becomes logical "0", the N-type transistor (N3 or N5) is turned off accordingly, so as to avoid the terminal (A or B) of the TSV (130 or 132) to be turned on to ground voltage. The transistor P3 and P5 are also turned off to avoid the second data path circuit (160 or 162) from transmitting the input signal Vin1.

Figure 6:
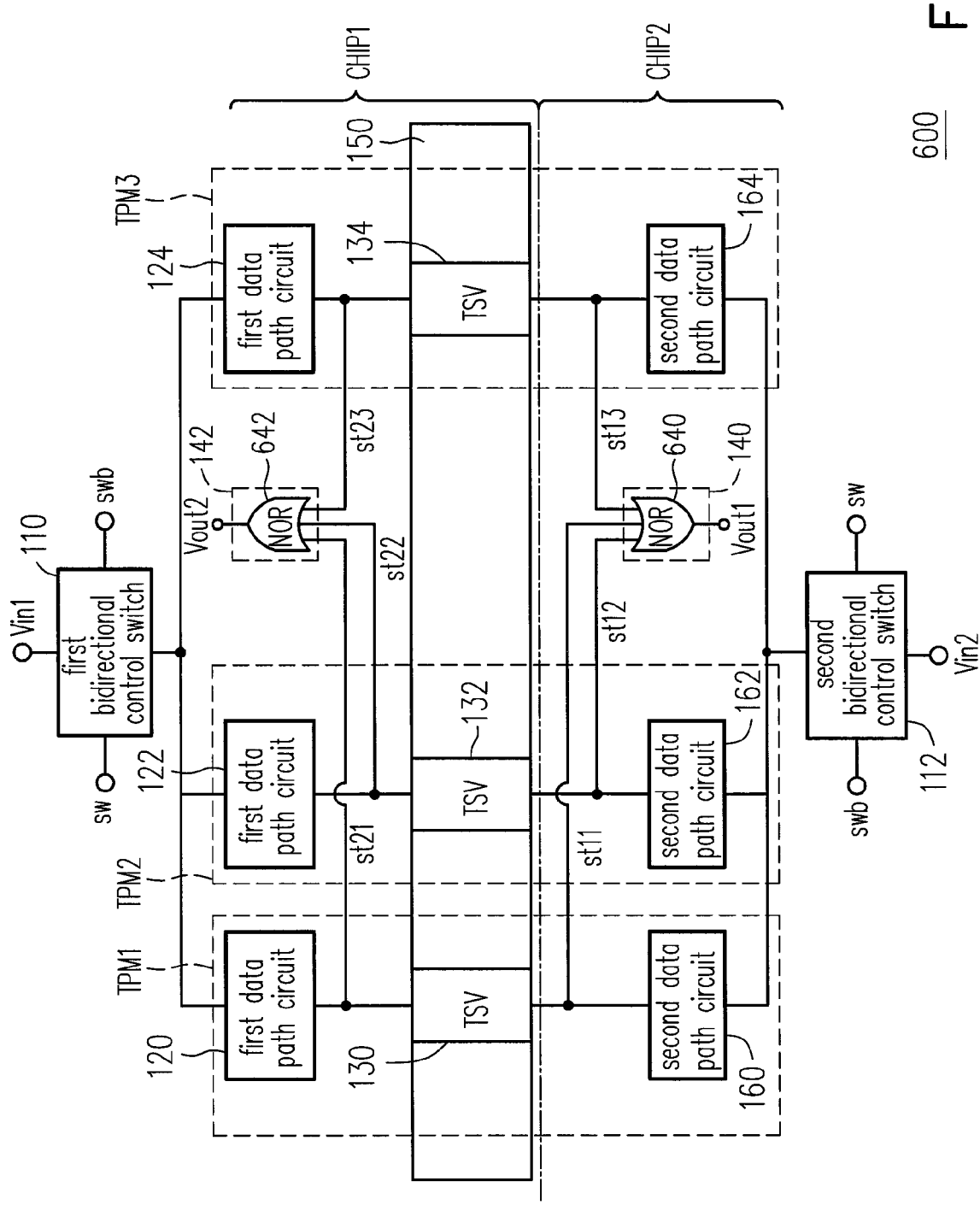
FIG. 6 is a circuit diagram illustrating a through silicon via (TSV) bidirectional repair circuit of a semiconductor device according to a second embodiment of the disclosure.

Despite that the TSV bidirectional repair circuit 100 depicted in FIG. 5 may not perform a correct data self-repair operation for status 7 as shown in Table (2), above problems may be solved by using another transmission path module as shown in FIG. 6. FIG. 6 is a circuit diagram illustrating a through silicon via (TSV) bidirectional repair circuit 600 of a semiconductor device according to a second embodiment of the disclosure. The TSV bidirectional repair circuit 600 of the embodiment is similar to the TSV repair circuit 100 of the first embodiment, the difference thereof lies where: The TSV bidirectional repair circuit 600 is implemented by using three transmission path modules TPM1 to TPM3, which means that a third transmission path module TPM3 is additionally included besides the transmission path modules TPM1 and TPM2. A second terminal of a TSV 134 of the third transmission path module TPM3 transmits a second transmission signal st23 of the third transmission path module TPM3 to the second output logical circuit 142 through the second data path circuit 164, a first terminal of the TSV 134 of the third transmission path module TPM3 transmits a first transmission signal st13 of the third transmission path module TPM3 to the first output logical circuit 140 through the first data path circuit 124.

That is, the first output logical circuit 140 includes a NOR gate 640 (i.e., the fourth NOR gate) having a first input terminal, a second input terminal and a third input terminal respectively receive three first transmission signals st11, st12 and st13 through the second terminals of the TSVs 130, 132 and 134 located at the second chip CHIP2. An output terminal of the NOR gate 640 generates the first output signal Vout1. That is, the second output logical circuit 142 includes a NOR gate 642 (i.e., the fifth NOR gate) having a first input terminal, a second input terminal and a third input terminal respectively receive three second transmission signals st21, st22 and st23 through the first terminals of the TSVs 130, 132 and 134 located at the first chip CHIP1. An output terminal of the NOR gate 642 generates the second output signal Vout2. Operations and functions not being mentioned in the second embodiment may be referred to the same in the previous embodiment and therefore not repeated herein.

Figure 7:
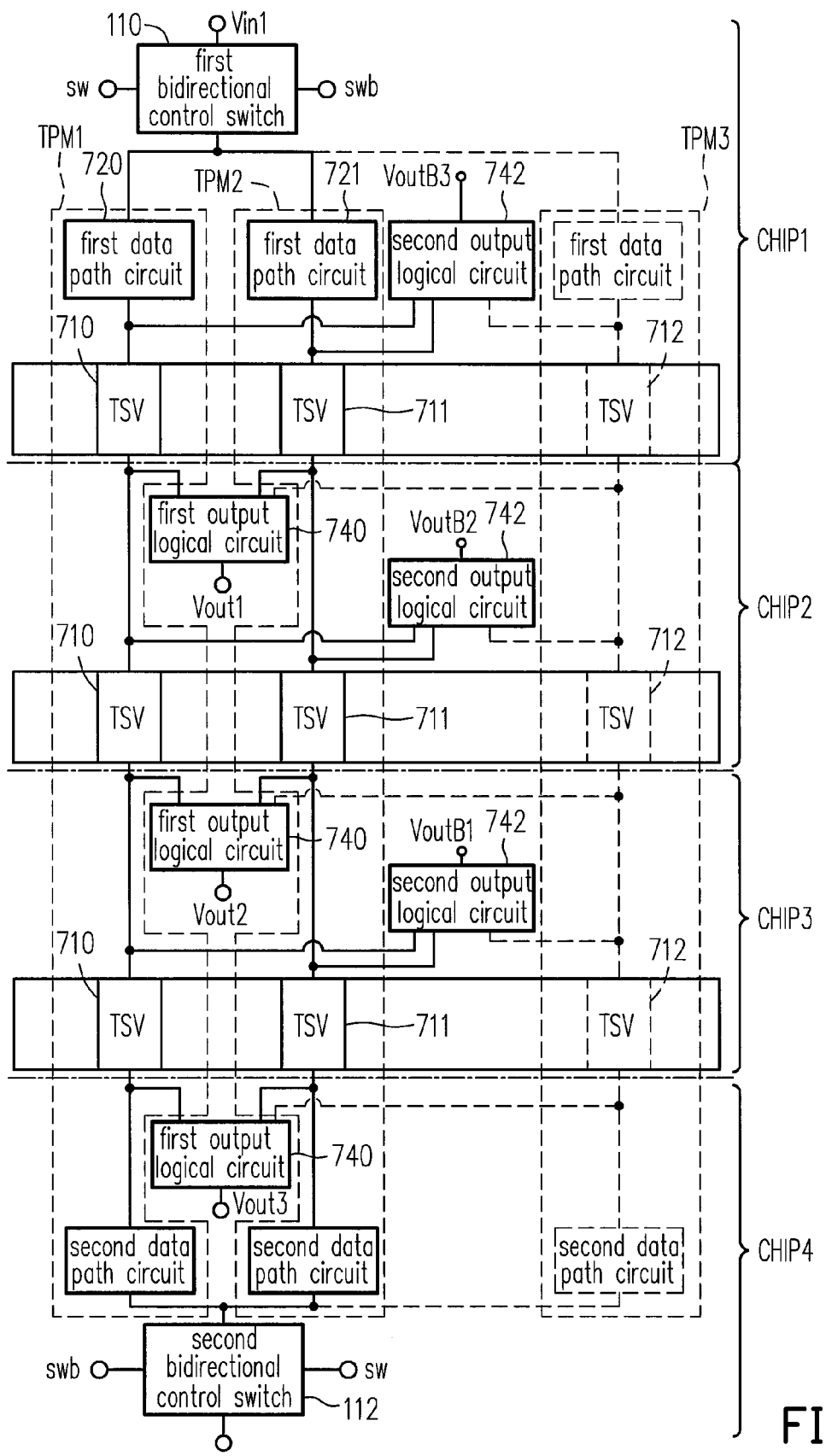
FIG. 7 is a schematic view illustrating a through silicon via (TSV) bidirectional repair circuit of a semiconductor device according to a third embodiment of the disclosure.

FIG. 7 is a schematic view illustrating a through silicon via (TSV) bidirectional repair circuit 700 of a semiconductor device according to a third embodiment of the disclosure. The TSV bidirectional repair circuit 700 is flexible in adopting 3DIC technology, such that the TSV bidirectional repair circuit 700 according to the spirit of the embodiment may also be used in stacked type chips. For instance, the transmission path modules TPM1 to TPM3 in the TSV bidirectional repair circuit 700 are disposed in a plurality of stacked type chips (e.g., the chips CHIP1 to CHIP4 as illustrated in FIG. 7), the signal may be transmitted from the first chip CHIP1 to the fourth chip CHIP4 through the chips CHIP2 and CHIP3 (the forward signal transmission), or from the fourth chip CHIP4 to the first chip CHIP1 through the chips CHIP2 and CHIP3 (the backward signal transmission). The transmission path modules TPM1 to TPM3 respectively include TSVs 710, 711 and 712 (which passing through different chips) in between the first chip CHIP1 and the fourth chip CHIP4. In other words, the TSVs 710, 711 and 712 of the transmission path modules TPM1 to TPM3 are respectively disposed on the first chip CHIP1 and the third chip CHIP3, and the TSVs 710, 711 and 712 located at different chips are turned on to each other.

The first output logical circuit 740 may be disposed on chips other than the first chip CHIP1 (e.g., the second chip CHIP2 to the fourth chip CHIP4) and having three input terminals respectively connected to terminals of the chips where the TSVs 710, 711 and 712 are located, so as to respectively receive a plurality of transmission signals. Accordingly, during the forward signal transmission, the first output logical circuit 740 located at different chips may generate output signals Vout1, Vout2 and Vout3 respectively at the second chip CHIP2 to the fourth chip CHIP4. The second output logical circuit 742 may be disposed on chips other than the fourth chip CHIP4 (e.g., the first chip CHIP1 to the third chip CHIP3) and having an input terminal connected to terminals of the chips where the TSVs 710, 711 and 712 are located, so as to receive a plurality of transmission signals. During the backward signal transmission, the second output logical circuit 742 located at different chips may generate output signals VoutB1, VoutB2 and VoutB3 respectively at the first chip CHIP1 to the third chip CHIP3. Accordingly, the TSV bidirectional repair circuit 700 may bidirectionally and correctly transmit the input signals Vin1 or Vin2 of the first chip CHIP1 and the fourth chip CHIP4 to the corresponding chips based on adjustment of the switch signal sw.

Figure 8:
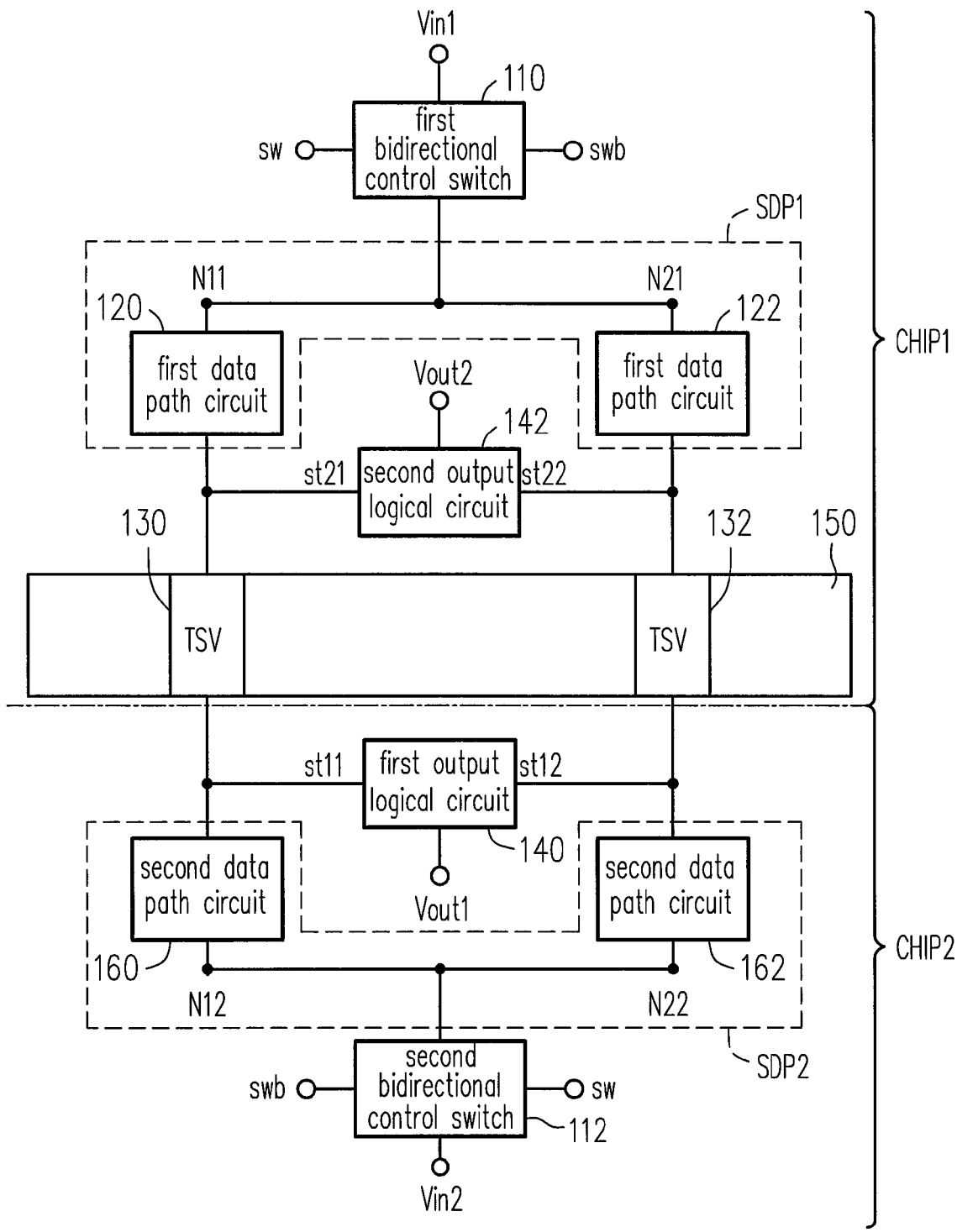
FIG. 8 is a schematic view illustrating a through silicon via (TSV) bidirectional repair circuit of a semiconductor device according to a fourth embodiment of the disclosure.

FIG. 8 is a schematic view illustrating a through silicon via (TSV) bidirectional repair circuit 800 of a semiconductor device according to a fourth embodiment of the disclosure. The TSV bidirectional repair circuit 800 of FIG. 8 is similar to the TSV bidirectional repair circuit 100 of FIG. 1, the difference thereof lies where: The TSV bidirectional repair circuit 100 depicted in FIG. 1 transmits data through the transmission path modules TPM1 (composed by the first data circuit 120, the TSV 130 and the second data path circuit 160) and TPM2 (composed by the first data circuit 122, the TSV 132 and the second data path circuit 162) and the output logical circuits 140 and 142, whereas the TSV bidirectional repair circuit 800 depicted in FIG. 8 comprises at least two data path modules SDP1 to SDP2 and at least two corresponding TSVs 130 and 132, and a plurality of output logical circuits 140 and 142. In other words, in the embodiment, two first data path circuits 120 and 122 are designed into the data path module SDP1 as the same module and two second data path circuits 160 and 162 are designed into the data path module SDP2 as another module, so as to transmit signals together with the corresponding TSV (130 or 132).

Each of the data path modules SDP1 and SDP2 may include at least two data path circuits having a same input terminal, the input terminal of each of the data path modules SDP1 and SDP2 is connected to the output terminals of the first and the second bidirectional switches 110 and 112 to receive the pending signals Vin1 or Vin2 respectively during the forward signal transmission or the backward signal transmission. For instance, in the data path module SDP1 composed by the first data path circuits 120 and 122, the two terminals N11 and N21 are connected to each other and to the output terminal of the first bidirectional switch 110. In the data path module SDP2 comprises the second data path circuits 160 and 162, the two terminals N12 and N22 are connected to each other and to the output terminal of the second bidirectional switch 112.

In each of the data path modules (e.g., the data path module SDP1), the output terminal of the data path circuit (e.g., the first data path circuits 120 or 122) is connected to the corresponding terminal of the TSV (130 or 132) leading to the next-stage chip (the second chip CHIP2) in the corresponding chip (the first chip CHIP1), so as to transmit data through the TSV (130 or 132) according to the switch signal sw or the opposite switch signal swb. On the other hand, in each of the data path module SDP2, the output terminal the second data path circuit (160 or 162) is connected to the corresponding terminal of the TSV (130 or 132) leading to the next-stage chip (the first chip CHIP1) in the corresponding chip (the second chip CHIP2), so as to transmit data through the TSV (130 or 132) according to the opposite switch signal swb or the switch signal sw. A plurality of output logical circuits (e.g., the output logical circuits 140 and 142) are respectively disposed on any one chip. The input terminal of the output logical circuits is connected to terminals at the same side of the TSV (130 or 132) in said any one chip to receive at least two transmission signals and respectively generate the output signal. For instance, the input terminal of the output logical circuit 140 is connected to the terminals of the TSV (130 or 132) at the same side in the second chip CHIP2 to receive the transmission signals st11 and st12 and generate output signal Vout1; The output logical circuit 142 is similar to the output logical circuit 140, thus related description is omitted herein. Detail description of the rest of devices may be referred to the description in the previous embodiments.

Figure 9:
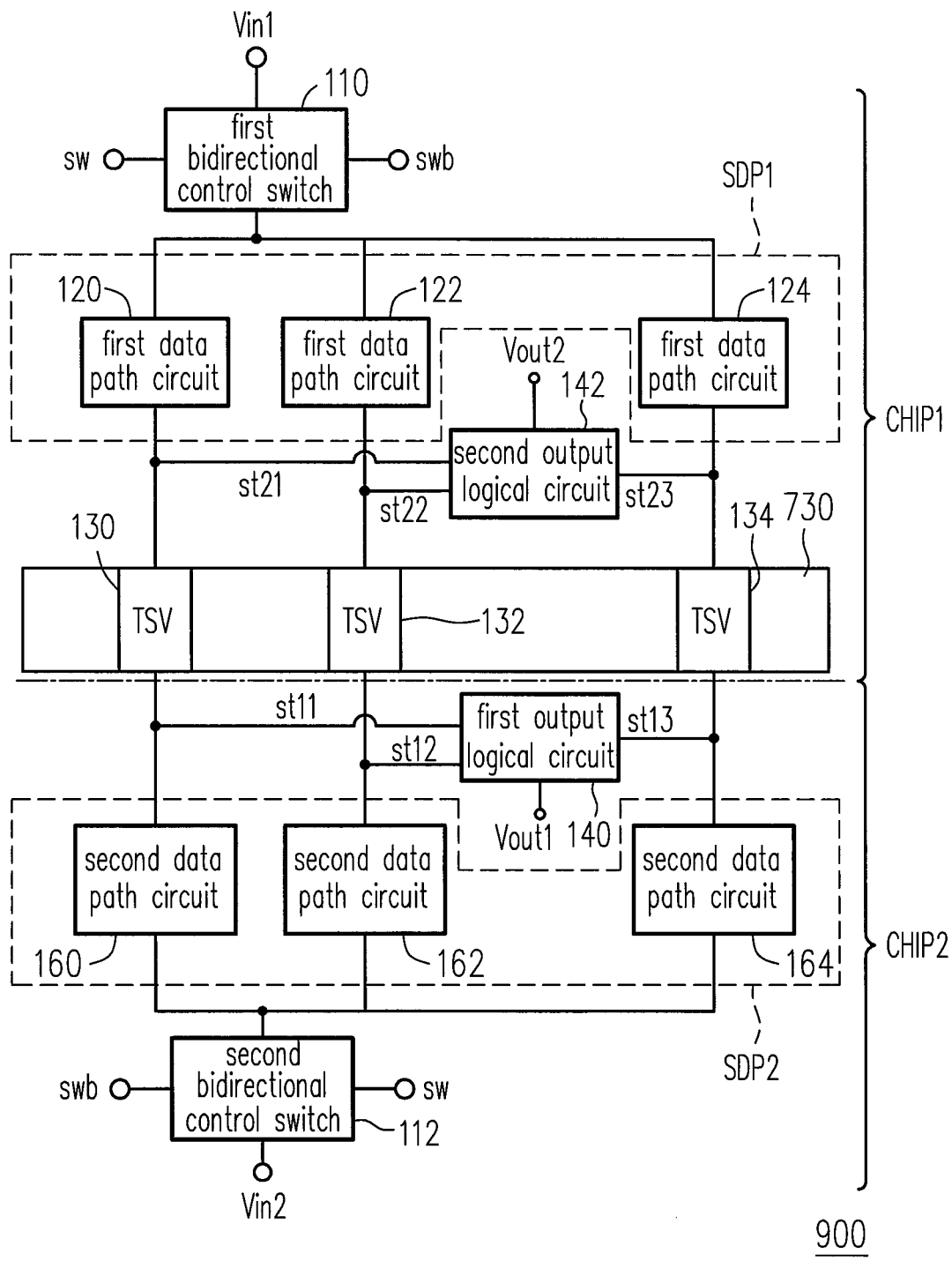
FIG. 9 is a schematic view illustrating a through silicon via (TSV) bidirectional repair circuit of a semiconductor device according to a fifth embodiment of the disclosure.

FIG. 9 is a schematic view illustrating a through silicon via (TSV) bidirectional repair circuit 900 of a semiconductor device according to a fifth embodiment of the disclosure. The fifth embodiment is similar to the fourth embodiment as illustrated in FIG. 8, the difference thereof lies where: Each of the data path modules SDP1 to SDP2 depicted in FIG. 8 includes two data path circuits (e.g., the first data path circuits 120 and 122, and the second data path circuits 160 and 162) and having two corresponding TSVs 130 and 132; Each of the data path modules SDP1 to SDP2 in the fifth embodiment of the disclosure includes three or more data path circuits (e.g., the first data path circuits 120, 122, and 124, and the second data path circuits 160, 162 and 164) and having three corresponding TSVs 130, 132 and 134. Therefore, in the disclosure, a number of circuits and their corresponding number of TSVs in each of the data path modules may be adjusted based on the actual requirement. Detail description of the rest of devices may be referred to the description in the previous embodiments.

Figure 10:
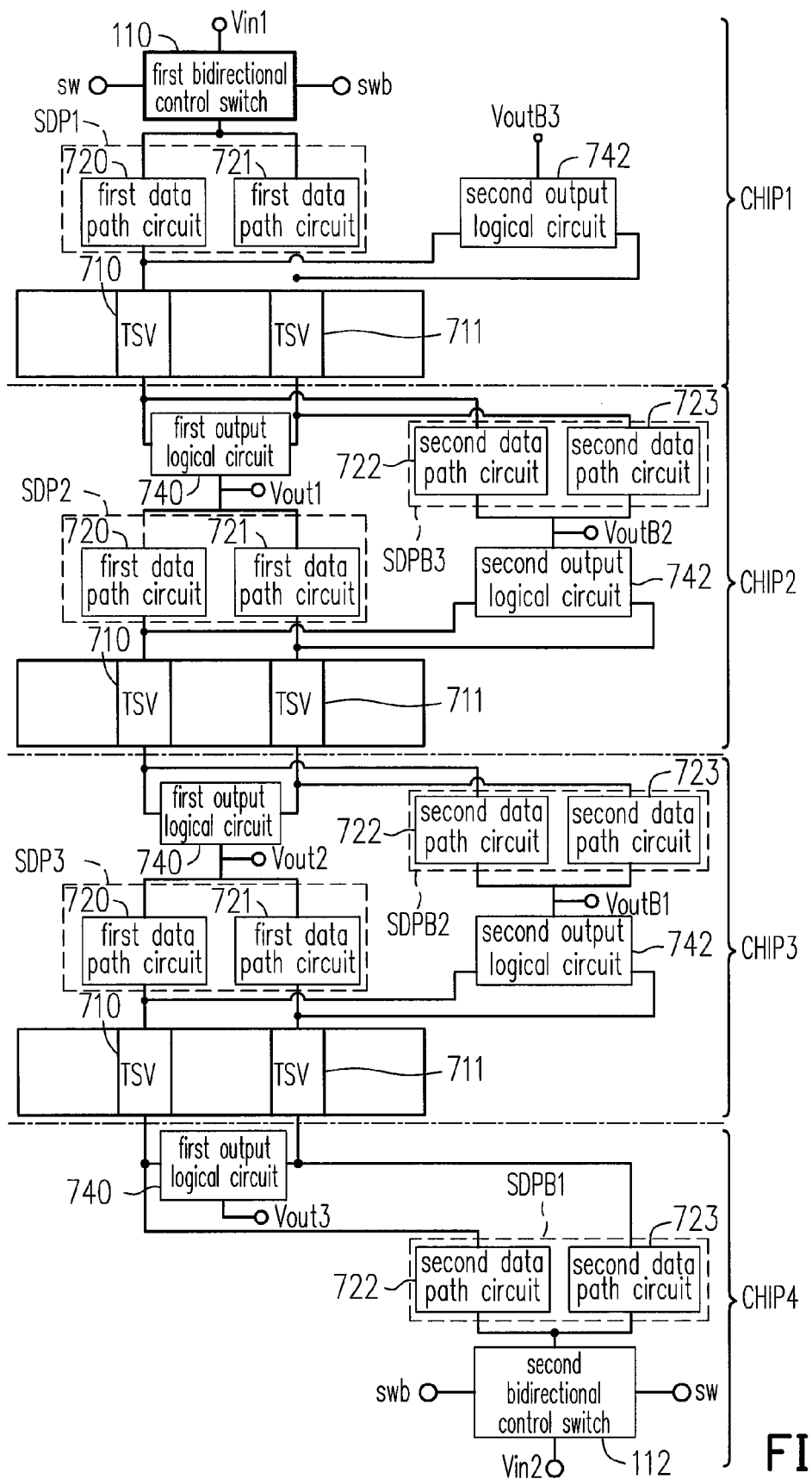
FIG. 10 is a schematic view illustrating a through silicon via (TSV) bidirectional repair circuit of a semiconductor device according to a sixth embodiment of the disclosure.

The implementation of the fourth to the fifth embodiments may also be used in multiple stacked chips as shown in FIG. 10. FIG. 10 is a schematic view illustrating a through silicon via (TSV) bidirectional repair circuit 1000 of a semiconductor device according to a sixth embodiment of the disclosure. The TSV repair circuit 1000 includes a plurality of chips (e.g., the first chip CHIP1 to the fourth chip CHIP4), the first bidirectional switch 110 and the second bidirectional switch 112, at least two TSVs 710 and 711, a plurality of data path modules SDP1 to SDP3 and SDPB1 to SDPB3 and a plurality of the output logical circuits 740 and 742. The chips CHIP1 to CHIP4, the first and the second bidirectional switches 110 and 112 and the TSVs 710 and 711 are all identical to the same as in the previous embodiments. In addition, the data path circuits 720 to 721 in each of the data path modules SDP1 to SDP3 are all identical to the first data path circuits 120 and 122 depicted in FIG. 1 and FIG. 8, and the data path circuits 722 to 723 in each of the data path modules SDPB1 to SDPB3 are all identical to the second data path circuits 160 and 162 depicted in FIG. 1 and FIG. 8, so related descriptions to the above is omitted hereinafter.

The plurality of data path modules SDP1 to SDP3 and SDPB1 to SDPB3 are disposed in all chips. Each of the data path modules SDP1 to SDP3 and SDPB1 to SDPB3 includes at least two data path circuits having a same input terminal, person skilled in the art may adjust the number of the data path circuits in each of the of the data path modules SDP1 to SDP2 and SDPB1 to SDPB3 based on actual requirements. Each of the transmission path modules SDP1 to SDP3 and SDPB1 to SDPB3 in FIG. 10 includes two data path circuits.

The input terminal of the data path module (e.g., the data path modules SDP1 or SDPB1) is connected to the output terminals of the first bidirectional switch 110 and the second bidirectional switch 112 to receive the input signals Vin1 or Vin2 respectively during forward signal transmission or the backward signal transmission.

The input terminal of the data path module (e.g., the data path modules SDP2 to SDP3 and SDPB2 to SDPB3) may also receive output signals from a previous-stage chip, and the output terminal of the data path circuit in each of the data path modules is respectively connected to the corresponding terminal of the TSV (710 or 711) leading to the next-stage chip in the corresponding chip, so as to transmit data through the TSV (710 or 711) according to the switch signal sw or the opposite switch signal swb. For instance, the input terminal of each of the data path modules SDP2 to SDP3 may also respectively receive the output signals Vout1 and Vout2 from the first output logical circuit 740 locate on the same chip, and the output terminal of each of the data path circuits 720 and 721 in the data path modules SDP2 to SDP3 is respectively connected to the terminal of the TSV (710 or 711) leading to the next-stage chip in the corresponding chip. Similarly, the input terminal of each of the data path modules DPB2 to SDPB3 may respectively receive output signals VoutB1 and VoutB2 through the second output logical circuit 742 on the same chip, and the output terminal of each of the data path circuits 722 and 723 in the data path modules SDP2 to SDP3 is respectively connected to the terminal of the TSV (710 or 711) leading to the next-stage chip in the corresponding chip. The output logical circuits 740 and 742 are respectively disposed on said all chips. The input terminals of the output logical circuits 740 and 742 are connected to the terminals of the TSVs 710 and 711 at the same side in said all chips, so as to receive at least two transmission signals and respectively generate the output signals Vout1 to Vout3 and VoutB1 to VoutB3.

In other words, it is assumed that the input signal Vin1 is transmitted from the first chip CHIP1 to the fourth chip CHIP4 through the chips CHIP2 to CHIP3 (the forward signal transmission). In this case, the switch signal sw is logical "1", the input signal Vin1 may pass through the data path module SDP1 and the first output logical circuit 740 located at the second chip CHIP2, so as to self-repair and transmit the input signal Vin1 to the second chip CHIP2 to generate the output signal Vout1. Next, the input signal Vin1 may pass through the data path module SDP2 and the first output logical circuit 740 located at the third chip CHIP3 to self-repair and transmit the input signal Vin1 to the third chip CHIP3 to generate the output signal Vout2. Lastly, the input signal Vin1 may pass through the data path module SDP3 and the first output logical circuit 740 located at the fourth chip CHIP4 to self-repair and transmit the input signal Vin1 to the third chip CHIP4 to generate the output signal Vout3. In contrast, when the input signal Vin2 is transmitted from the fourth chip CHIP4 to the first chip CHIP1 through the chips CHIP3 to CHIP2 (the backward signal transmission). In this case, the switch signal sw is logical "0", the input signal Vin2 may pass through the data path module SDPB1 and the second output logical circuit 742 located at the third chip CHIP3, so as to self-repair and transmit the input signal Vin1 to the third chip CHIP3 to generate the output signal VoutB1. Accordingly, the input signal Vin2 may be self-repaired and transmitted to the second output logical circuit 742 of the second chip CHIP2 to generate the output signal VoutB2, and transmitted to the second output logical circuit 742 of the first chip CHIP1 to generate the output signal VoutB3. As a result, during the forward signal transmission, each time the input signal Vin1 is transmitted by the TSV bidirectional repair circuit 1000 to pass one of the chips, the first output logical circuit 740 may be used to self-repair the input signal Vin1 into identical signals as the output signals Vout1 to Vout3; and during the backward signal transmission, each time the input signal Vin2 is transmitted by the TSV bidirectional repair circuit 1000 to pass one of the chips, the second output logical circuit 742 may be used to self-repair the input signal Vin2 into identical signals as the output signals VoutB1 to VoutB3, thereby increasing stability of the data transmission.

In view of above, the TSV bidirectional repair circuit of the embodiment is configured to use two bidirectional switches, a switch signal and an opposite switch signal to transmit data bidirectional in between a plurality of chips, and whether short-circuit on and a TSV and a silicon substrate is present may be determined according to an input signal, the switch signal or an opposite signal and a level of the TSV. Also, once short-circuit on the TSV is present, the TSV bidirectional repair circuit may turn off the power voltage and/or connect the TSV to the ground voltage, so as to avoid the leakage current to flow into the silicon substrate thereby preventing the voltage level in the silicon substrate to shift. Each of the output logical circuits may also self-repair the output signals into correct ones according to a plurality of transmission signals already transmitted, which allows the semiconductor device (e.g., 3DIC) to transmit data correctly and bidirectional even if a partial of the TSVs is in a short-circuit condition.

It will be apparent to those skilled in the art that various modifications and variations can be made to the structure of the disclosed embodiments without departing from the scope or spirit of the disclosure. In view of the foregoing, it is intended that the disclosure cover modifications and variations of this specification provided they fall within the scope of the following claims and their equivalents.

It is intended that the specification and examples be considered as exemplary only, with a true scope of the disclosure being indicated by the following claims and their equivalents.

What is claimed is:
1. A through silicon via (TSV) bidirectional repair circuit of a semiconductor apparatus, comprising:
   a first chip and a second chip, wherein the first chip and the second chip are stacked on top of each other;
   a first bidirectional switch and a second bidirectional switch respectively disposed on the first chip and the second chip, wherein the first bidirectional switch and the second bidirectional switch respectively receive a switch signal and an opposite switch signal as to determine whether to transmit an input signal of the first chip or the second chip to an output terminal;
   at least two transmission path modules, wherein each of the transmission path modules has two terminals respectively connected to the output terminals of the first bidirectional switch and the second bidirectional switch, and each of the transmission path modules comprises at least one through silicon via (TSV); and
   a first output logical circuit and a second output logical circuit respectively disposed on the second chip and the first chip, wherein input terminals of the first output logical circuit and the second output logical circuit are respectively connected to a second terminal and a first terminal of the at least one TSV to respectively receive at least two first transmission signals and at least two second transmission signals, so as to respectively generate a first output signal and a second output signal,
   wherein, each of the transmission path modules comprises:

the at least one TSV, wherein each of the at least one TSV passes through a silicon substrate to transmit signals between the first chip and the second chip to each other;

a first data path circuit and a second data path circuit respectively disposed on the first chip and the second chip, wherein input terminals of the first data path circuit and the second data path circuit are respectively connected to the output terminals of the first bidirectional switch and the second bidirectional switch to receive the input signal of the first chip or the second chip, and output terminals of the first data path circuit and the second data path circuit are respectively connected to the first terminal and the second terminal of the at least one TSV to transmit data through the at least one TSV according to one of the switch signal and the opposite switch signal; and wherein, the first data path circuit and the second data path circuit respectively comprise:

an input driving circuit to receive the input signal, convert the input signal into a pending signal according to a first level voltage and a second level voltage, and transmit the pending signal to a corresponding terminal of the at least one TSV;

a short-circuit detection circuit connected to the corresponding terminal of the at least one TSV to detect whether short-circuit on the at least one of TSV and the silicon substrate is present according to the input signal, a level of the corresponding terminal of the at least one TSV and one of the opposite switch signal and the switch signal and generate a short-circuit detection output signal; and a leakage current cancellation circuit connected to the short-circuit detection circuit and the input driving circuit to avoid a leakage current generated by the first level voltage to flow into the silicon substrate according to the short-circuit detection output signal.

2. The TSV bidirectional repair circuit of claim 1, wherein the at least two transmission path modules comprise a first transmission path module and a second transmission path module, wherein each of the first data path circuits in the first transmission path module and the second transmission path module respectively transmits the first transmission signal of the first transmission path module and the first transmission signal of the second transmission path module to the first output logical circuit through a corresponding one of the at least one TSV, and each of the second data path circuits in the first transmission path module and the second transmission path module respectively transmits the second transmission signal of the first transmission path module and the second transmission signal of the second transmission path module to the second output logical circuit through the corresponding one of the at least one TSV.

3. The TSV bidirectional repair circuit of claim 2, wherein the first output logical circuit comprises:

a second NOR gate having a first input terminal and a second input terminal to respectively receive two said first transmission signals through the second terminal of the at least one TSV, and an output terminal to generate the first output signal, and, the second output logical circuit comprises:

a third NOR gate having a first input terminal and a second input terminal to respectively receive two said second transmission signals through the first terminal of the at least one TSV, and an output terminal to generate the second output signal.

4. The TSV bidirectional repair circuit of claim 2, wherein the at least two transmission path modules further comprise a third transmission path module, wherein the first data path circuit in the third transmission path module transmits the first transmission signal of the third transmission path module to the first output logical circuit through the corresponding one of the at least one TSV, and the second data path circuit in the third transmission path module transmits the second transmission signal of the third transmission path module to the second output logical circuit through the corresponding one of the at least one TSV.

5. The TSV bidirectional repair circuit of claim 4, wherein the first output logical circuit comprises:

a fourth NOR gate having a first input terminal, a second input terminal and a third input terminal to respectively receive three said first transmission signals through the second terminal of the at least one TSV, and an output terminal to generate the first output signal, and, the second output logical circuit comprises:

a fifth NOR gate having a first input terminal, a second input terminal and a third input terminal to respectively receive three said second transmission signals through the first terminal of the at least one TSV, and an output terminal to generate the second output signal.

6. The TSV bidirectional repair circuit of claim 1, wherein the leakage current cancellation circuit comprises:

a power control circuit connected to the short-circuit detection circuit to determine whether to stop providing the first level voltage according to the short-circuit detection output signal and the opposite switch signal or the switch signal.

7. The TSV bidirectional repair circuit of claim 6, wherein the power control circuit comprises:

a OR gate having a first input terminal to receive one of the opposite switch signal and the switch signal, a second input terminal to receive the short-circuit detection output signal and an output terminal to generate a first-switch switch signal; and a first switch having a first terminal to receive the first level voltage, a second terminal connected to a power terminal of the input driving circuit, and a control terminal to receive the first-switch switch signal.

8. The TSV bidirectional repair circuit of claim 1, wherein the leakage current cancellation circuit comprises:

a short-circuit protection circuit connected to the short-circuit detection circuit and the at least one TSV to determine whether to turn on the first terminal of the at least one TSV to the second level voltage according to the short-circuit detection output signal, wherein the first level voltage is greater than the second level voltage.

9. The TSV bidirectional repair circuit of claim 8, wherein the short-circuit protection circuit comprises:

a second switch having a first terminal connected to the corresponding terminal of the at least one TSV, a second terminal connected to the second level voltage, and a control terminal to receive the short-circuit detection output signal.

10. The TSV bidirectional repair circuit of claim 1, wherein the input driving circuit comprises:

a signal inverter having a first terminal to receive the input signal, a power terminal to receive the first level voltage and an output terminal connected to the corresponding terminal of the at least one TSV, wherein the pending signal is opposite to the input signal.

11. The TSV bidirectional repair circuit of claim 10, wherein the signal inverter comprises:

a first N-type transistor and a first P-type transistor, wherein control terminals of the first N-type transistor and the first P-type transistor are configured to respectively receive the input signal, a first terminal of the first P-type transistor receives the first level voltage, a second terminal of the first P-type transistor is connected to the first terminal of the first N-type transistor to be used as an output terminal of the signal inverter, and a second terminal of the first N-type transistor is configured to receive the second level voltage.

12. The TSV bidirectional repair circuit of claim 1, wherein the short-circuit detection circuit comprises:
a first NOR gate having a first input terminal connected to the corresponding terminals of the at least one TSV, a second input terminal to receive the input signal, a third input terminal to receive the opposite switch signal or the switch signal, and an output terminal to generate the short-circuit detection output signal.

13. The TSV bidirectional repair circuit of claim 1, wherein the first data path circuit and the second data path circuit respectively further comprise:
a bias circuit having a first terminal connected to an output terminal of the short-circuit detection circuit to maintain a bias voltage of the short-circuit detection output signal.

14. The TSV bidirectional repair circuit of claim 13, wherein the bias circuit comprises:
a bias resistor having a first terminal connected to the output terminal of the short-circuit detection circuit, and a second terminal to receive the second level voltage.

15. The TSV bidirectional repair circuit of claim 13, wherein the bias circuit comprises a second N-type transistor having a first terminal and a control terminal connected to the output terminal of the short-circuit detection circuit, and a second terminal to receive the second level voltage.

16. The TSV bidirectional repair circuit of claim 13, wherein the bias circuit comprises a second P-type transistor having a first terminal connected to the output terminal of the short-circuit detection circuit, a second terminal and a control terminal to receive the second level voltage.

17. The TSV bidirectional repair circuit of claim 1, further comprising:
at least one chip stacked on top of each other with the first chip and the second chip, wherein the at least one TSV of each of the transmission path modules is respectively disposed on the at least one chip and turned on to each other.

18. A through silicon via (TSV) bidirectional repair circuit of a semiconductor apparatus, comprising:
a plurality of chips stacked on top of each other, and the plurality of chips comprise a first chip and a second chip;
a first bidirectional switch and a second bidirectional switch respectively disposed on the first chip and the second chip, wherein the first bidirectional switch and the second bidirectional switch respectively receive a switch signal and an opposite switch signal as to determine whether to transmit an input signal of the first chip or the second chip to an output terminal;
at least two TSVs respectively passed through a silicon substrate to transmit signals between the plurality of chips; and
at least two data path modules, wherein each of said data path modules comprises at least two data path circuits having a same input terminal, wherein an input terminal of each of said data path modules is connected to output terminals of the first bidirectional switch and the second bidirectional switch respectively to receive the input signal, and an output terminal of each said data path circuits in each said data path modules is connected to terminals of the at least two TSVs leading to a next-stage chip in a corresponding chip, so as to transmit data through the at least two TSVs according to one of the switch signal and the opposite switch signal; and
a plurality of output logical circuits respectively disposed on any one chip, wherein the input terminal in each of the output logical circuits is connected to terminals of the at least two TSVs at a same side in said any one chip, so as to receive at least two transmission signals to generate the output signal,
wherein each of the data path circuits comprises:
an input driving circuit to receive the input signal, convert the input signal into a pending signal according to a first level voltage and a second level voltage, and transmit the pending signal to a corresponding terminal of a corresponding one of the TSV;
a short-circuit detection circuit connected to the corresponding terminal of the at least a TSV to detect whether short-circuit on the corresponding one of the TSVs and a silicon substrate is present according to the input signal, a level of the corresponding terminal of the corresponding one of the TSVs and one of the opposite switch signal or the switch signal and generate a short-circuit detection output signal; and
a leakage current cancellation circuit connected to the short-circuit detection circuit and the input driving circuit to avoid a leakage current generated by the first level voltage to flow into the silicon substrate according to the short-circuit detection output signal.

19. The TSV bidirectional repair circuit of claim 18, wherein the at least two TSVs comprise a first TSV and a second TSV, and,
each of the transmission path modules includes two said data path circuits.

20. The TSV bidirectional repair circuit of claim 19, wherein each of the output logical circuits comprises:
a second NOR gate having a first input terminal and a second input terminal to respectively receive two said transmission signals through the terminals of the first TSV and the second TSV at the same side in said any one chip, and an output terminal to generate each of the corresponding output signal.

21. The TSV bidirectional repair circuit of claim 19, wherein the at least two TSVs further comprise a third TSV, and each of the data path module includes three of said data path circuits.

22. The TSV bidirectional repair circuit of claim 21, wherein each of the output logical circuits comprises:
a third NOR gate having a first input terminal, a second input terminal and a third terminal to respectively receive three transmission signals through the terminals of the first TSV, the second TSV and the third TSV at the same side in said any one chip, and an output terminal to generate the output signal.

23. The TSV bidirectional repair circuit of claim 18, wherein the leakage current cancellation circuit comprises:
a power control circuit connected to the short-circuit detection circuit to determine whether to stop providing the first level voltage according to the short-circuit detection output signal and one of the opposite switch signal and the switch signal.

24. The TSV bidirectional repair circuit of claim 23, wherein the power control circuit comprises:
a OR gate having a first input terminal to receive one of the opposite switch signal and the switch signal, a second input terminal to receive the short-circuit detection output signal and an output terminal to generate a first-switch switch signal; and
a first switch having a first terminal to receive the first level voltage, a second terminal connected to a power terminal of the input driving circuit, and a control terminal to receive the first-switch switch signal.

25. The TSV bidirectional repair circuit of claim 18, wherein the leakage current cancellation circuit comprises:
a short-circuit protection circuit connected to the short-circuit detection circuit and corresponding terminals of the at least two TSVs to determine whether to turn on the corresponding terminals of the at least two TSVs to the second level voltage according to the short-circuit detection output signal, wherein the first level voltage is greater than the second level voltage.

26. The TSV bidirectional repair circuit of claim 25, wherein the short-circuit protection circuit comprises:
a second switch having a first terminal connected to the corresponding terminal of the at least a TSV, a second terminal connected to the second level voltage, and a control terminal to receive the short-circuit detection output signal.

27. The TSV bidirectional repair circuit of claim 18, wherein the input driving circuit comprises:
a signal inverter having a first terminal to receive the input signal, a power terminal to receive the first level voltage and an output terminal connected to the corresponding terminal of the at least a TSV, wherein the pending signal is opposite to the input signal.

28. The TSV bidirectional repair circuit of claim 27, wherein the signal inverter comprises:
a first N-type transistor and a first P-type transistor, wherein control terminals of the first N-type transistor and the first P-type transistor are configured to respectively receive the input signal, a first terminal of the first P-type transistor receives the first level voltage, a second terminal of the first P-type transistor is connected to the first terminal of the first N-type transistor to be used as an output terminal of the signal inverter, and a second terminal of the first N-type transistor is configured to receive the second level voltage.

29. The TSV bidirectional repair circuit of claim 18, wherein the short-circuit detection circuit comprises:
a first NOR gate having a first input terminal connected to the corresponding terminals of the at least a TSV, a second input terminal to receive the input signal, a third input terminal to receive the opposite switch signal or the switch signal, and an output terminal to generate the short-circuit detection output signal.

30. The TSV bidirectional repair circuit of claim 18, wherein each of the data path circuits further comprises:
a bias circuit having a first terminal connected to an output terminal of the short-circuit detection circuit to maintain a bias voltage of the short-circuit detection output signal.

31. The TSV bidirectional repair circuit of claim 30, wherein the bias circuit comprises:
a bias resistor having a first terminal connected to the output terminal of the short-circuit detection circuit, and a second terminal to receive the second level voltage.

32. The TSV bidirectional repair circuit of claim 30, wherein the bias circuit comprises a second N-type transistor having a first terminal and a control terminal connected to the output terminal of the short-circuit detection circuit, and a second terminal to receive the second level voltage.

33. The TSV bidirectional repair circuit of claim 30, wherein the bias circuit comprises a second P-type transistor having a first terminal connected to the output terminal of the short-circuit detection circuit, a second terminal and a control terminal to receive the second level voltage.

34. A through silicon via (TSV) bidirectional repair circuit of a semiconductor apparatus, comprising:
a plurality of chips stacked on top of each other, and the plurality of chips comprise a first chip and a second chip;
a first bidirectional switch and a second bidirectional switch respectively disposed on the first chip and the second chip, wherein the first bidirectional switch and the second bidirectional switch respectively receive a switch signal and an opposite switch signal as to determine whether to transmit an input signal of the first chip or the second chip to an output terminal;
at least two TSVs respectively passed through a silicon substrate to transmit signals between the plurality of chips;
a plurality of data path modules disposed on all chips, wherein each of said data path modules comprises at least two data path circuits having a same input terminal, an input terminal of each of said data path modules is connected to output terminals of the first bidirectional switch and the second bidirectional switch respectively to receive the input signal, or receive pre-stage output signal, and an output terminal of each of said data path circuits in each said data path modules is connected to terminals of the at least two TSVs leading to a next-stage chip in a corresponding chip, so as to transmit data through the at least two TSVs according to one of the switch signal or the opposite switch signal; and
a plurality of output logical circuits respectively disposed on said all chip, wherein the input terminal in each of the output logical circuits is connected to terminals of the at least two TSVs at a same side in said all chip, so as to receive at least two transmission signals to generate the output signal,
wherein each of the data path circuits comprises:
an input driving circuit to receive the input signal, convert the input signal into a pending signal according to a first level voltage and a second level voltage, and transmit the pending signal to a corresponding terminal of a corresponding one of the TSV;
a short-circuit detection circuit connected to the corresponding terminal of the corresponding one the TSVs to detect whether short-circuit on the corresponding one of the TSVs and a silicon substrate is present according to the input signal, the voltage of the corresponding terminal of the at least two TSVs and one of the opposite switch signal and the switch signal and generate a short-circuit detection output signal; and
a leakage current cancellation circuit connected to the short-circuit detection circuit and the input driving circuit to avoid a leakage current generated by the first level voltage to flow into the silicon substrate according to the short-circuit detection output signal.

35. The TSV bidirectional repair circuit of claim 34, wherein one data path module and one output logical are disposed respectively to the first chip and the second chip, and two data path modules and two output logical circuits are disposed in any chip stacked between the first chip and the second chip.

36. The TSV bidirectional repair circuit of claim 35, wherein the at least two TSVs comprise a first TSV and a second TSV, and,
each of the transmission path modules includes two said data path circuits.

37. The TSV bidirectional repair circuit of claim 36, wherein each of the output logical circuits comprises:
a second NOR gate having a first input terminal and a second input terminal to respectively receive two said transmission signals through the terminals of the first TSV and the second TSV at the same side in said any one chip, and an output terminal to generate each of the corresponding output signal.

38. The TSV bidirectional repair circuit of claim 36, wherein the at least two TSVs further comprise a third TSV, and each of the data path module includes three of said data path circuits.

39. The TSV bidirectional repair circuit of claim 38, wherein each of the output logical circuits comprises:
a third NOR gate having a first input terminal, a second input terminal and a third terminal to respectively receive three transmission signals through the terminals of the first TSV, the second TSV and the third TSV at the same side in said any one chip, and an output terminal to generate the output signal.

40. The TSV bidirectional repair circuit of claim 34, wherein the leakage current cancellation circuit comprises:
a power control circuit connected to the short-circuit detection circuit to determine whether to stop providing the first level voltage according to the short-circuit detection output signal and the opposite switch signal or the switch signal.

41. The TSV bidirectional repair circuit of claim 40, wherein the power control circuit comprises:
a OR gate having a first input terminal to receive the opposite switch signal or the switch signal, a second input terminal to receive the short-circuit detection output signal and an output terminal to generate a first-switch switch signal; and
a first switch having a first terminal to receive the first level voltage, a second terminal connected to a power terminal of the input driving circuit, and a control terminal to receive the first-switch switch signal.

42. The TSV bidirectional repair circuit of claim 34, wherein the leakage current cancellation circuit comprises:
a short-circuit protection circuit connected to the short-circuit detection circuit and corresponding terminals of the at least a TSV to determine whether to turn on the corresponding terminals of the at least a TSV to the second level voltage according to the short-circuit detection output signal, wherein the first level voltage is greater than the second level voltage.

43. The TSV bidirectional repair circuit of claim 42, wherein the short-circuit protection circuit comprises:
a second switch having a first terminal connected to the corresponding terminal of the at least a TSV, a second terminal connected to the second level voltage, and a control terminal to receive the short-circuit detection output signal.

44. The TSV bidirectional repair circuit of claim 34, wherein the input driving circuit comprises:
a signal inverter having a first terminal to receive the input signal, a power terminal to receive the first level voltage and an output terminal connected to the corresponding terminal of the at least a TSV, wherein the pending signal is opposite to the input signal.

45. The TSV bidirectional repair circuit of claim 44, wherein the signal inverter comprises:
a first N-type transistor and a first P-type transistor, wherein control terminals of the first N-type transistor and the first P-type transistor are configured to respectively receive the input signal, a first terminal of the first P-type transistor receives the first level voltage, a second terminal of the first P-type transistor is connected to the first terminal of the first N-type transistor to be used as an output terminal of the signal inverter, and a second terminal of the first N-type transistor is configured to receive the second level voltage.

46. The TSV bidirectional repair circuit of claim 34, wherein the short-circuit detection circuit comprises:
a first NOR gate having a first input terminal connected to the corresponding terminals of the at least a TSV, a second input terminal to receive the input signal, a third input terminal to receive the opposite switch signal or the switch signal, and an output terminal to generate the short-circuit detection output signal.

47. The TSV bidirectional repair circuit of claim 34, wherein each of the data path circuits further comprises:
a bias circuit having a first terminal connected to an output terminal of the short-circuit detection circuit to maintain a bias voltage of the short-circuit detection output signal.

48. The TSV bidirectional repair circuit of claim 47, wherein the bias circuit comprises:
a bias resistor having a first terminal connected to the output terminal of the short-circuit detection circuit, and a second terminal to receive the second level voltage.

49. The TSV bidirectional repair circuit of claim 47, wherein the bias circuit comprises a second N-type transistor having a first terminal and a control terminal connected to the output terminal of the short-circuit detection circuit, and a second terminal to receive the second level voltage.

50. The TSV bidirectional repair circuit of claim 47, wherein the bias circuit comprises a second P-type transistor having a first terminal connected to the output terminal of the short-circuit detection circuit, a second terminal and a control terminal to receive the second level voltage.

* * * * *